US009630162B1

(12) United States Patent
Sunkara et al.

(10) Patent No.: US 9,630,162 B1
(45) Date of Patent: Apr. 25, 2017

(54) REACTOR AND METHOD FOR PRODUCTION OF NANOSTRUCTURES

(75) Inventors: Mahendra Kumar Sunkara, Louisville, KY (US); Jeong H. Kim, Louisville, KY (US); Vivekanand Kumar, Louisville, KY (US)

(73) Assignee: University of Louisville Research Foundation, Inc., Louisville, KY (US)

( * ) Notice: Subject to any disclaimer, the term of this patent is extended or adjusted under 35 U.S.C. 154(b) by 43 days.

(21) Appl. No.: 13/439,592

(22) Filed: Apr. 4, 2012

Related U.S. Application Data

(63) Continuation-in-part of application No. 12/248,731, filed on Oct. 9, 2008, now abandoned.

(60) Provisional application No. 60/978,673, filed on Oct. 9, 2007.

(51) Int. Cl.
*B01J 12/02* (2006.01)
*C01F 7/42* (2006.01)
*C01G 19/02* (2006.01)
*C01G 25/02* (2006.01)
*C01G 9/03* (2006.01)

(52) U.S. Cl.
CPC .............. *B01J 12/02* (2013.01); *C01F 7/424* (2013.01); *C01G 9/03* (2013.01); *C01G 19/02* (2013.01); *C01G 25/02* (2013.01)

(58) Field of Classification Search
CPC .......... B01J 12/002; B01J 12/02; C01F 7/424; C01G 9/03; C01G 19/02; C01G 25/02; H05H 1/42; H05H 1/30; H05H 2001/4607; H05H 2001/4615; H05H 2001/4622
USPC .................. 204/157.51, 157.44, 157.43; 422/186–187; 423/592.1–594.19
See application file for complete search history.

(56) References Cited

U.S. PATENT DOCUMENTS

| 3,071,678 | A | * | 1/1963 | Neely et al. ............... 219/76.16 |
| 3,443,897 | A | * | 5/1969 | Hoekje et al. ............... 423/613 |
| 3,464,792 | A | | 9/1969 | Herriman et al. |
| 3,585,006 | A | | 6/1971 | Di Palma |

(Continued)

FOREIGN PATENT DOCUMENTS

| DE | 19828692 A1 | * | 1/1999 | ............. C01G 19/02 |
| JP | 2002336688 A | * | 11/2002 | ............. B01J 19/08 |

OTHER PUBLICATIONS

Chou et al, "Plasma production of metallic nanoparticles," J. Mater. Res. vol. 7, No. 8, Aug. 1992, pp. 2107-2113.*

(Continued)

*Primary Examiner* — Keith Hendricks
*Assistant Examiner* — Colleen M Raphael
(74) *Attorney, Agent, or Firm* — Joan Simunic

(57) ABSTRACT

A reactor and method for production of nanostructures, including metal oxide nanowires or nanoparticles, are provided. The reactor includes a regulated metal powder delivery system in communication with a dielectric tube; a plasma-forming gas inlet, whereby a plasma-forming gas is delivered substantially longitudinally into the dielectric tube; a sheath gas inlet, whereby a sheath gas is delivered into the dielectric tube; and a microwave energy generator coupled to the dielectric tube, whereby microwave energy is delivered into a plasma-forming gas. The method for producing nanostructures includes providing a reactor to form nanostructures and collecting the formed nanostructures, optionally from a filter located downstream of the dielectric tube.

11 Claims, 22 Drawing Sheets

(56) References Cited

U.S. PATENT DOCUMENTS

| | | |
|---|---|---|
| 3,743,708 A * | 7/1973 | Chase et al. ............ 423/617 |
| 3,764,272 A | 10/1973 | Sterling |
| 3,817,711 A | 6/1974 | Kugler et al. |
| 3,954,431 A * | 5/1976 | Fleming et al. ............ 501/65 |
| 4,022,872 A * | 5/1977 | Carson et al. ........ 422/186.22 |
| 5,015,349 A * | 5/1991 | Suib et al. ............ 204/157.15 |
| 5,134,946 A | 8/1992 | Poovey |
| 5,412,173 A | 5/1995 | Muehlberger |
| 5,587,207 A | 12/1996 | Gorokhovsky |
| 5,618,770 A | 4/1997 | Dath et al. |
| 5,788,738 A | 8/1998 | Pirzada et al. |
| 5,951,771 A | 9/1999 | Raney et al. |
| 6,372,156 B1 * | 4/2002 | Kong et al. ............ 75/392 |
| 6,379,419 B1 * | 4/2002 | Celik et al. ............ 75/346 |
| 6,409,851 B1 * | 6/2002 | Sethuram et al. ... 118/723 MW |
| 6,689,192 B1 | 2/2004 | Phillips et al. |
| 6,806,228 B2 | 10/2004 | Sharma et al. |
| 6,919,054 B2 * | 7/2005 | Gardner ............ B01J 19/26 422/186 |
| 7,125,537 B2 * | 10/2006 | Liao et al. ............ 423/592.1 |
| 7,182,812 B2 | 2/2007 | Sunkara et al. |
| 7,238,232 B1 | 7/2007 | Sunkara et al. |
| 7,241,432 B2 | 7/2007 | Sharma et al. |
| 7,252,811 B2 | 8/2007 | Sunkara et al. |
| 7,445,671 B2 | 11/2008 | Sunkara et al. |
| 7,547,431 B2 * | 6/2009 | Yadav et al. ............ 423/592.1 |
| 7,591,897 B2 | 9/2009 | Sunkara et al. |
| 7,597,941 B2 | 10/2009 | Sunkara et al. |
| 7,678,339 B2 * | 3/2010 | Wira ............ B01J 19/26 422/186.26 |
| 7,713,352 B2 | 5/2010 | Sunkara et al. |
| 7,771,689 B2 | 8/2010 | Sunkara et al. |
| 7,776,303 B2 | 8/2010 | Hung et al. |
| 7,819,974 B2 | 10/2010 | Sunkara et al. |
| 8,147,793 B2 * | 4/2012 | Put et al. ............ 423/594.14 |
| 2003/0143153 A1 * | 7/2003 | Boulos et al. ............ 422/186.03 |
| 2004/0009118 A1 * | 1/2004 | Phillips et al. ............ 422/186.04 |
| 2004/0045807 A1 | 3/2004 | Sarkas et al. |
| 2005/0163696 A1 | 7/2005 | Uhm et al. |
| 2005/0217421 A1 | 10/2005 | Boulos et al. |
| 2005/0258149 A1 | 11/2005 | Glukhoy et al. |
| 2005/0260119 A1 | 11/2005 | Sunkara et al. |
| 2006/0051505 A1 | 3/2006 | Kortshagen et al. |
| 2007/0029291 A1 * | 2/2007 | Boulos et al. ............ 219/121.59 |
| 2007/0075052 A1 * | 4/2007 | Fanson et al. ............ 219/121.52 |
| 2007/0087470 A1 | 4/2007 | Sunkara et al. |
| 2007/0118938 A1 | 5/2007 | Sunkara et al. |
| 2007/0221635 A1 * | 9/2007 | Boulos et al. ............ 219/121.59 |
| 2007/0243337 A1 | 10/2007 | Xiong et al. ............ 427/553 |
| 2007/0253874 A1 * | 11/2007 | Foret ............ 422/186.07 |
| 2007/0266825 A1 * | 11/2007 | Ripley et al. ............ 422/186 |
| 2007/0292340 A1 * | 12/2007 | Plischke et al. ............ 423/613 |
| 2008/0305025 A1 * | 12/2008 | Vitner et al. ............ 423/263 |
| 2010/0059360 A1 * | 3/2010 | Wendling ............ 422/186 |
| 2010/0176524 A1 * | 7/2010 | Burgess et al. ............ 977/840 |
| 2012/0028124 A1 | 2/2012 | Sunkara et al. |

OTHER PUBLICATIONS

Vollath et al, "Synthesis of nanosized ceramic oxide powders by microwave plasma reactions," Nanostructured Materials vol. 1., pp. 427-437, 1992.*

* cited by examiner

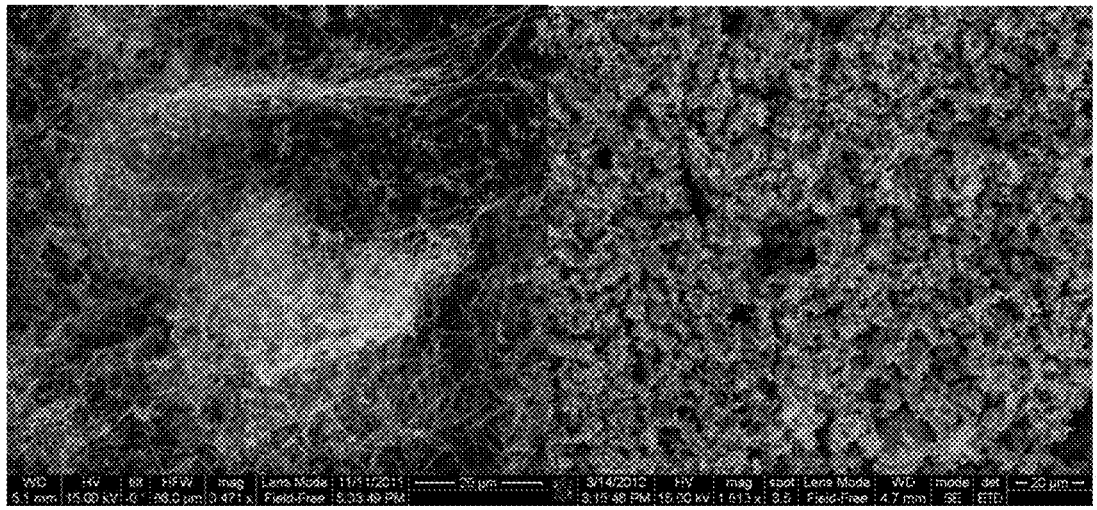
FIG. 21E  FIG. 21F
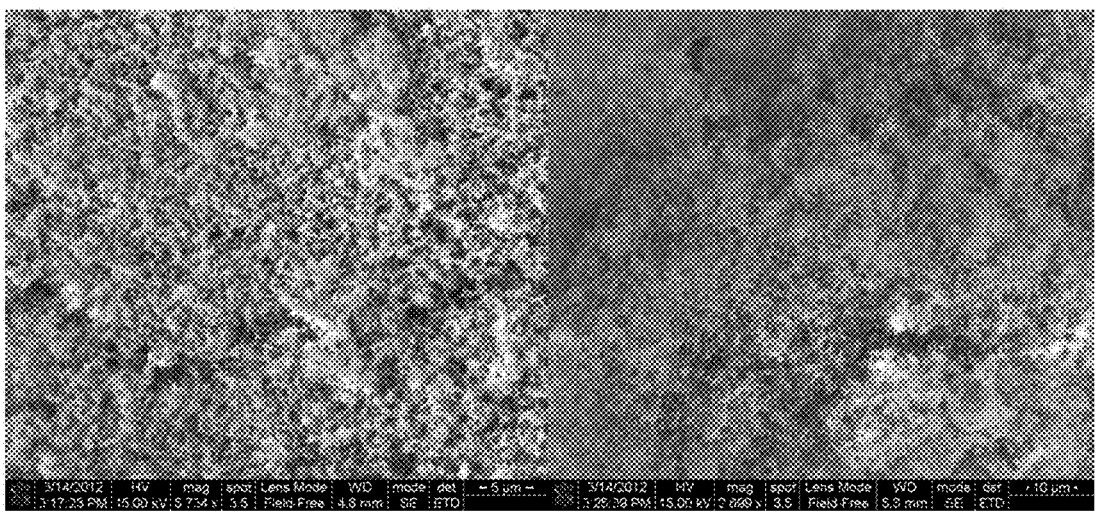
FIG. 21G  FIG. 21H

REACTOR AND METHOD FOR PRODUCTION OF NANOSTRUCTURES

CROSS-REFERENCE TO RELATED APPLICATIONS

This application is a continuation-in-part of U.S. application Ser. No. 12/248,731, filed Oct. 9, 2008, which claims priority from U.S. Provisional Patent Application No. 60/978,673, filed Oct. 9, 2007, the entire disclosures of which are incorporated herein by this reference.

GOVERNMENT INTEREST

The invention was made with U.S. Government support under grant number W9113M-04-C-0024 awarded by the U.S. Army Space Missile Defense Command; grant number DE-FG36-05G085013A awarded by the U.S. Department of Energy; and grant number DE-FG02-05ER64071 awarded by the U.S. Department of Energy. The Government has certain rights in the invention.

FIELD OF THE INVENTION

This invention relates to the field of nanotechnology, and more particularly to a reactor and method for the production of nanostructures, such as nanowires and nanoparticles.

INTRODUCTION

Nanostructures, such as nanowires and nanoparticles, can have unique applications and are beginning to be used in electronics, optoelectronics, electrochemical cells, nano-electromechanical devices, catalysis, and several other fields. Unique properties of nanowires include high aspect ratio, low conductivity, high surface to volume ratio and enhanced material characteristics due to quantum confinement effects. Synthesis of bulk quantities of nanowires with controlled composition, crystallinity, and morphology is important to continued development and commercialization of nanowire technology. For many applications, nanowire quantities of several grams or more are needed. Similarly, bulk production of nanoparticles are needed.

Metal oxide nanowires have been synthesized in a variety of ways. Some of these methods include (i) direct plasma and thermal oxidation using hydrogen and oxygen-containing gas phase of low-melting metal melts supplied through the gas phase onto a substrate; (ii) chemical vapor transport of metal using hot-filaments onto substrates using chemical vapor deposition in low oxygen-containing atmospheres; (iii) exposure of metal foils to low-pressure, weakly ionized, fully dissociated, cold oxygen plasmas; (iv) chemical vapor deposition of metal oxides in the presence of catalysts, e.g., iron metal particles; (v) thermal evaporation synthesis of zinc oxide nanowires; and (vi) synthesis of zinc oxide nanowires using a radio-frequency (RF), high power plasma.

Many of the previously-described approaches involve nanowire synthesis on a substrate. Other approaches have used catalysts or high temperature evaporation of a precursor. It can be difficult, time consuming, and expensive to produce large quantities of nanowires using these methods.

Other approaches, such as synthesis of zinc oxide nanowires using an RF, high power plasma, have not proven the ability to produce nanowires in a consistent, efficient, and cost-effective manner. See Peng, et al., "Plasma Synthesis of Large Quantities of Zinc Oxide Nanorods," *J. Phys. Chem.*, 111, 194-200 (2000). Attempts to use RF, high power plasmas to produce nanowires suffer the drawbacks of requiring high power input, high gas flow rates, and careful control of reaction temperature gradients. See id. Alternatives to nanowire synthesis which overcome the limitations of the known processes are needed. Similarly, alternatives to nanoparticle synthesis which overcome the limitations of the known processes are needed.

SUMMARY

The present invention includes a reactor and method for production of nanostructures, for example, metal oxide nanowires and nanoparticles.

The present invention includes a reactor for producing metal oxide nanostructures, such as nanowires and nanoparticles. In one embodiment, the reactor comprises a metal powder delivery system wherein the metal powder delivery system includes a funnel in communication with a dielectric tube; a plasma-forming gas inlet also in communication with the dielectric tube, and configured to deliver a plasma-forming gas substantially longitudinally into the dielectric tube; a sheath gas inlet also in communication with the dielectric tube, and configured to deliver a sheath gas into the dielectric tube; and a microwave energy generator coupled to the dielectric tube, and configured to deliver microwave energy into the dielectric tube and to the plasma-forming gas. In one embodiment, the reactor further includes a recycle system to recycle any unreacted metal to a plasma formed in the dielectric tube. In some embodiments the metal powder delivery system is regulated to thereby deliver metal powder at a set and/or predetermined flow rate into the dielectric tube. In some embodiments, the flow rate is set or fluctuates over time.

In some embodiments, the reactor further comprises a product collector that, in certain embodiments, includes a filter. In some embodiments, the filter is oriented longitudinally with respect to the dielectric tube. In some embodiments, the product collector further comprises and exhaust.

The present invention also includes a method for producing metal oxide nanostructures, such as nanowires and nanoparticles. In some embodiments, the method comprises providing a reactor comprising a metal powder delivery system, a dielectric tube, and a product collector that comprises a filter; delivering a plasma-forming gas substantially longitudinally into the dielectric tube; delivering a sheath gas into the dielectric tube; forming a plasma from the plasma-forming gas by applying microwave energy to the plasma-forming gas; delivering a metal powder into the dielectric tube; reacting the metal powder within the plasma at a certain microwave energy level to form metal oxide nanowires or metal oxide nanoparticles; and collecting the metal oxide nanowires or metal oxide nanoparticles. In one embodiment, the method further includes delivering a bulk of the metal powder substantially into the center of the plasma. Further embodiments comprise delivering the metal powder into the dielectric tube with a metal powder delivery system at a flow rate that is, in some embodiments, regulated. Still further embodiments of the method comprise the step of collecting the formed metal oxide nanowires or metal oxide nanoparticles from a collecting cup, from a filter that optionally may be located in a product collector, and/or from the dielectric tube.

The present invention produces bulk quantities of nanostructures, such as nanowires and nanoparticles quickly and at a fraction of the cost of known processes for making nanostructures. Practice of the present invention produces bulk quantities of highly pure metal oxide nanostructures using a high throughput plasma reactor. By using the reactors and methods described herein, nanostructures can be produced very quickly. In some embodiments, reacting metal powders into metal oxides nanostructures can take less than one second. For example, it can take only about one minute to produce about 10 grams of nanostructures. The reactor and methods described herein can be used to produce nanostructures in quantities of a kilogram, or more, per day.

The present invention can be used to produce highly pure nanostructure products. Since there is no need for any catalyst, substrate, or template to produce nanostructures, foreign material contamination of the nanostructure product can be avoided or minimized. In contrast, nanostructure products made using known synthesis methods often contain materials other than the nanostructure such as catalyst particles. Because the nanostructure products produced by the present invention are highly pure, expensive and time consuming purification processes can be minimized or even avoided completely.

The present invention can be used to produce nanostructures more cost effectively than known synthesis methods. For example, the present invention does not use high power or high temperatures which are associated with known processes for preparing nanostructures. Reactor designs described herein can be continuously operated for extended periods of time without significant heating of the reactor. Thus, the present invention can avoid the expenses associated with high power and high temperature operation. In addition, the present invention does not use catalysts, substrates, or templates and thus can achieve cost savings over known processes that require such materials. Further, the present invention can produce nanostructures without using expensive precursor materials such as, for example, precursor materials used in thermal evaporation processes. The present invention has demonstrated, in one embodiment, reaction efficiency of about 90% when 100 nm metal powder particles were used.

In some embodiments, the present invention uses lower gas volumes than known processes for making nanostructures in the gas phase. A lower gas volume can reduce waste disposal expenses and can also simplify separation procedures used to recover nanostructure products from process gases. Lower gas volumes can also reduce the amount of heat input that is necessary to provide appropriate conditions for making nanostructures.

The reactor of the present invention can be modular and can be easily adapted or modified to suit production needs. Further, because the reactor can be modular, the reactor can be easily serviced, for example, by swapping reactor components as needed.

In some embodiments, the plasma is formed at pressures at or near atmospheric pressure. Practice of the present invention at or near atmospheric pressure can produce nanostructures without the use of expensive vacuum components.

In certain embodiments of the present invention, the reactors and methods of the present invention advantageously provide relatively smooth airflow within the reactor so as to further provide for the superior and efficient production of metal oxide nanoparticles and nanowires having high aspect ratios.

BRIEF DESCRIPTION OF THE DRAWINGS

FIGS. 21A to 21I are photomicrographs of nanowires collected from various portions of a reactor according to the present invention, including photomicrographs of nanowires that were collected from the dielectric tube of a reactor according to one embodiment of the present invention (FIGS. 21A to 21B); photomicrographs of nanowires that were collected from the filter of a product collector according to one embodiment of the present invention (FIGS. 21C to 21E); and photomicrographs of nanowires that were collected from a collecting cup of a product collector according to one embodiment of the present invention (FIGS. 21F TO 21I).

DESCRIPTION OF EXEMPLARY EMBODIMENTS

Figure 1:
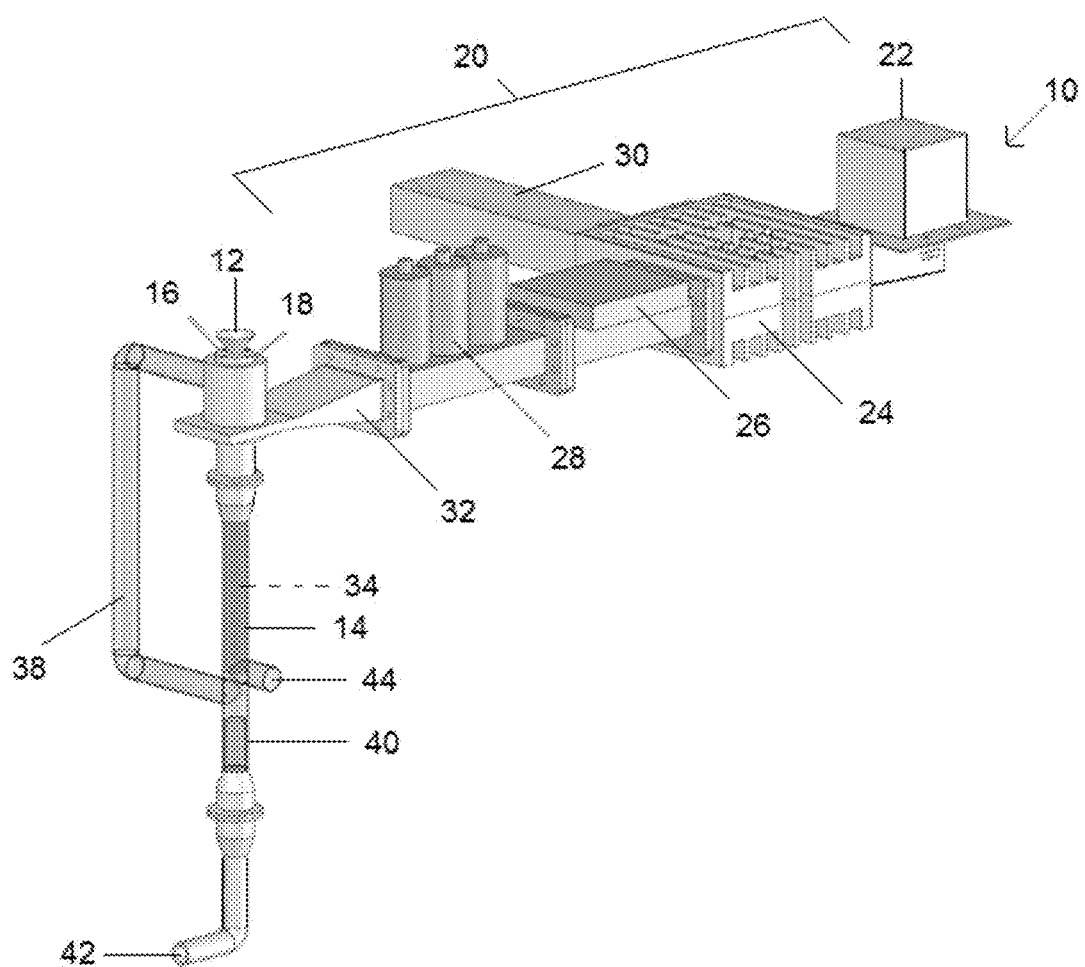
FIG. 1 is a schematic representation of a reactor for producing nanostructures according to one embodiment of the present invention.

Nanostructures can be described in terms of their longest and shortest dimensions. For example, the aspect ratio of a nanostructure is the ratio of a nanostructure's longest dimension to the nanostructure's shortest dimension. Generally, a nanoparticle is a nanostructure having an aspect ratio of 1. In some embodiments, a nanoparticle is a nanostructure having a diameter of the nanoscale, that is, from 1 nanometer to hundreds of nanometers, but below 1 micron. Generally, a nanowire is a nanostructure that has an aspect ratio greater than 1, i.e., the nanoparticle's longest dimension is greater than the particle's shortest dimension. As used herein, the term "nanowire" refers to a nanostructure that has an aspect ratio greater than 1. In some embodiments, the nanowires of the present invention have an aspect ratio, e.g., an individual or an average aspect ratio, of at least 1.5 such as at least about 2. In other embodiments, the nanowires of the present invention have an aspect ratio e.g., an individual or an average aspect ratio, of at least about 10, at least about 50, or at least about 75, for example, the nanowires can have an aspect ratio of about 10 to about 150 or about 50 to about 125, such as about 100. In some instances, the nanowires can have a length ranging from about 1 to about 100 microns such as, for example, about 10 microns and a diameter of about 15 to about 200 nanometers (nm) such as, for example, about 100 nanometers.

As the term is used herein, "nanowires" can include individually separate nanowires as well as intertwined or connected nanowires. For example, in one embodiment of the invention, nanowires are joined together or agglomerated to form a star-burst shaped mass. See, for example, FIGS. 12B and 12C, described infra.

As the term is used herein, "nanoparticles" can include individually separate nanoparticles as well as connected nanoparticles. For example, in one embodiment of the invention, nanoparticles are joined together or agglomerated. See, for example, FIGS. 18B and 19B, described infra.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

As used herein, the term "about," when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

The present invention includes a reactor for producing metal oxide nanostructures. In one embodiment, the reactor includes a metal powder delivery system wherein the metal powder delivery system includes a funnel in communication with a dielectric tube; a plasma-forming gas inlet also in communication with the dielectric tube, whereby a plasma-forming gas is delivered substantially longitudinally into the dielectric tube; a sheath gas inlet also in communication with the dielectric tube, whereby a sheath gas is delivered into the dielectric tube; and a microwave energy generator coupled to the dielectric tube, whereby microwave energy is delivered into the dielectric tube and to the plasma-forming gas.

As the term is used herein, "longitudinally" or "longitudinal" means "along the major (or long) axis" as opposed to latitudinal which means "along the width, transverse, or across." For example, in one embodiment of the invention, plasma-forming gas is delivered substantially into and along the length of the dielectric tube.

FIG. 1 is a schematic representation of one embodiment of a reactor. Reactor 10 includes a metal powder and plasma-forming gas delivery system 12, dielectric tube 14, sheath gas inlets 16 and 18, and microwave energy generator 20. In one embodiment, metal powder and plasma-forming gas delivery system 12 includes a funnel in communication with dielectric tube 14. The funnel of metal powder and plasma-forming gas delivery system 12 can be, for example, a conical funnel. In some embodiments, described more fully infra, metal powder and plasma-forming gas delivery system 12 is cooled, for example, the metal powder and plasma-forming gas delivery system is liquid cooled. Metal powder and plasma-forming gas delivery system 12 can also include a plasma-forming gas inlet in communication with dielectric tube 14. The plasma-forming gas inlet can be configured to deliver plasma-forming gas substantially longitudinally into dielectric tube 14.

In one embodiment of the present invention, the metal powder delivery system can be regulated. As used herein, the term "regulate" or "regulated" generally refers to the capability to be tuned to a set or predetermined value. In the context of metal powder delivery systems, regulated refers to a metal powder delivery systems that can be tuned to deliver metal powder at a set or predetermined flow rate. For example, in some embodiments, a metal powder delivery system is regulated to deliver metal powder to a reactor at 1 to 600 grams per hour. In some embodiments, the metal powder delivery system is calibrated so that a user can regulate the flow rate to a predetermined value. In some embodiments, the regulated flow rate is constant over time. In one embodiment of the present invention, the regulated metal powder delivery system can be chosen from powder feeder PF-700 or PF-3350 (Plasma Powders and Systems Inc., Marlboro, N.J.).

With further regard to the regulation of the metal powder delivery systems of the present invention, in some embodiments, regulating the flow of metal powder into the delivery system allows for the production of metal oxide nanoparticles and nanowires continuously. In one embodiment, the regulated metal powder delivery system contributes to the reactor's ability to produce nanoparticles and nanowires of relatively uniform dimensions. Without being bound by theory or mechanism, in certain embodiments, it is believed that this increased uniformity can be due to the regulation of the delivery of the metal powder producing a consistent stream of metal powder to the plasma, thereby reducing potential disruptions to the plasma.

The dielectric tube 14 can be made of any one of several dielectric materials known to those of ordinary skill in the art. For example, in one embodiment, dielectric tube 14 is a quartz tube or a tube of a related material. In other embodiments, dielectric tube is a ceramic or a related material. Dielectric tube 14 can have an inside diameter, for example, of about 1 millimeter (mm) to about 60 mm such as about 5 to about 10 mm, about 10 to about 65 mm, about 10 to about 50 mm, about 10 to about 40 mm, about 15 to about 25 mm, about 15 to about 35 mm, about 20 to about 25 mm, or about 20 to about 30 mm. Without being held to any particular theory, it is believed that the diameter of the dielectric tube is important so that the plasma (described in more detail infra) distributes uniformly within the tube. Preferably, the plasma should occupy a large portion of the tube's cross section without touching or melting the tube. It is thought that a dielectric tube that is substantially larger in diameter than the plasma formed within can result in substantial quantities of unreacted metal powder during operation of the reactor.

In some instances, the diameter of the dielectric tube changes as a function of the tube's length. For example, the diameter of the dielectric tube can be smaller in the section of the tube in which a plasma is generated and larger downstream of the plasma. In one embodiment, the inside diameter of the dielectric tube is about 22 mm in the section of the tube in which a plasma is generated and is about 10 centimeters (cm) in diameter further downstream. It is thought that by increasing the diameter of the dielectric tube downstream of the plasma, wall deposition of particles can be reduced. In some instances, however, the diameter of the dielectric tube can be chosen to encourage deposition of particles on the walls of the dielectric tube. For example, relatively small dielectric tube diameters are believed to contribute to increased particle deposition on the walls of the dielectric tube during operation of the reactor.

Dielectric tube 14 can have a length, for example, of about 20 centimeters (cm) to about 200 cm. In one particular embodiment, dielectric tube 14 has a length of about 75 cm. Proper orientation of dielectric tube 14 can be determined depending on the particular process requirements. In one instance, dielectric tube 14 can be vertical. In other instances, dielectric tube 14 can be angled or horizontal.

Sheath gas inlets 16 and 18 are in communication with dielectric tube 14 and can be used to deliver a sheath gas to dielectric tube 14. In another embodiment, sheath gas inlets 16 and 18 can be configured to deliver either a sheath gas or a plasma-forming gas, or both a sheath gas and a plasma-forming gas, to dielectric tube 14. Sheath gas inlet 16 and sheath gas inlet 18 can be angled with respect to a longitudinal axis of the dielectric tube. In some instances, only one of sheath gas inlet 16 or sheath gas inlet 18 is angled with respect to a longitudinal axis of the dielectric tube. For example, one or both gas inlets can be angled at less than 90° such as at about 10° to about 80°, about 15° to about 75°, about 20° to about 70°, about 25° to about 65°, about 30° to about 60°, about 40° to about 50°, such as about 45°, about 42°, about 44°, about 46°, or about 48°, with respect to a longitudinal axis of the dielectric tube. In some embodiments, the angle of a gas inlet can produce a helical gas path in the dielectric tube when gas is delivered through the gas inlet. For example, the angle of a gas inlet can produce a helical sheath gas path in the dielectric tube when sheath gas is delivered through the gas inlet. A helical sheath gas path in the dielectric tube can help to contain the plasma and keep the dielectric tube cool during operation of the reactor.

Microwave energy generator 20 can include, for example, magnetron 22, circulator 24, power detector 26 (e.g., a forward and reflected power detector), tuner 28 (e.g., a three stub tuner), and load 30. Microwave energy generator 20 can be coupled to dielectric tube 14 via coupler 32. In one embodiment, coupler 32 is a tapered waveguide which surrounds dielectric tube 14. Microwave energy produced by microwave energy generator 20 is delivered to dielectric tube 14 via coupler 32. In some embodiments, microwave energy generator 20 produces microwave energy at 2.45 gigahertz (GHz).

Figure 2:
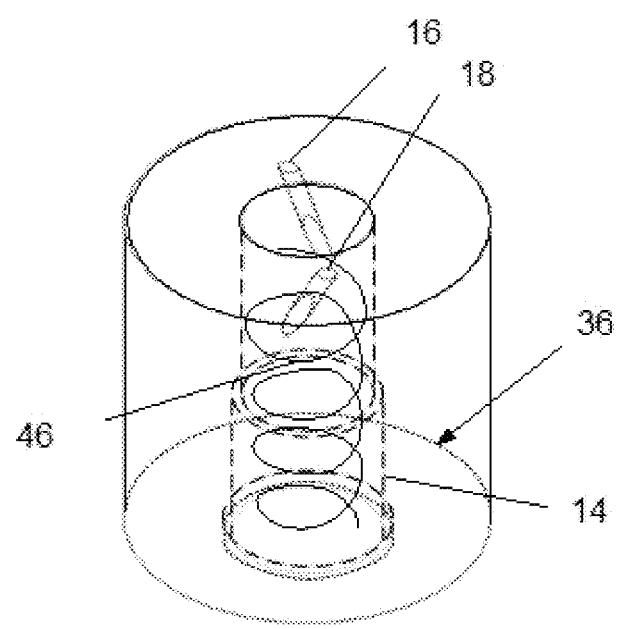
FIG. 2 is a schematic representation of a helical gas path in a dielectric tube according to one embodiment of the present invention.

Microwave energy produced by microwave energy generator 20 is delivered to the plasma-forming gas contained in dielectric tube 14 to produce plasma 34. With reference to FIG. 2, in some embodiments, a device such as holder 36 is used to hold dielectric tube 14.

Referring again to FIG. 1, in one embodiment, reactor 10 includes a recycle. For example, reactor 10 can include recycle system 38 in communication with dielectric tube 14. In one embodiment, recycle system 38 is also in communication with a plasma-forming gas inlet. Recycle system 38 can also include a nanostructure separator. A nanostructure separator such as, for example, a cyclone, can be used to remove, completely or partially, nanostructures from a reaction product stream exiting the bottom of dielectric tube 14 before unreacted metal is recycled to the plasma.

Reactor 10 can also include a nanostructure product collector such as product gathering cup 40. In some embodiments, the nanostructure product collector contains a baffle or other device to slow gas velocity and disentrain nanostructure product from the reaction product stream. In another embodiment, the nanostructure product collector is a powder collecting cup wherein the diameter of the powder collecting cup is less than the inner diameter of the dielectric tube so that gases can escape from the bottom of the powder collecting cup. In additional embodiments, a powder collecting cup is porous to the gases so that the gases can escape through the powder collecting cup. Excesses gases can be vented, for example, via exhaust line 42.

In one embodiment, reactor 10 includes inlet port 44 for introducing a precursor feed for downstream reaction. For example, inlet port 44 can be used to introduce a precursor feed for thin film formation.

In one embodiment, reactor 10 does not contain any additional heating elements or any additional heat insulating materials. For example, in some embodiments, dielectric tube 14 is not covered with heat insulation. In additional embodiments, reactor 10 does not contain any igniters to ignite the plasma. For example, reactor 10 does not contain any ignition device to ignite the plasma. In one particular embodiment, microwave energy produced by microwave energy generator 20 is delivered to dielectric tube 14 via coupler 32 and the microwave energy is capable of igniting the plasma. In another embodiment, a metal ignition rod with pointed ends (not illustrated) is used to ignite the plasma.

FIG. 2 is a schematic representation of one embodiment of the present invention having helical gas path 46 within dielectric tube 14. Sheath gas inlet 16 and sheath gas inlet 18 are shown angled with respect to a longitudinal axis of the dielectric tube. The angle of a gas inlet can produce a helical gas path in the dielectric tube when gas is delivered through the gas inlet. For example, the angle of a sheath gas inlet can produce a helical sheath gas path in the dielectric tube when sheath gas is delivered through the sheath gas inlet. In another embodiment, the angle of a sheath gas inlet can produce a helical sheath gas and plasma-forming gas path in the dielectric tube when sheath gas and plasma-forming gas are delivered through the sheath gas inlet.

Figure 3:
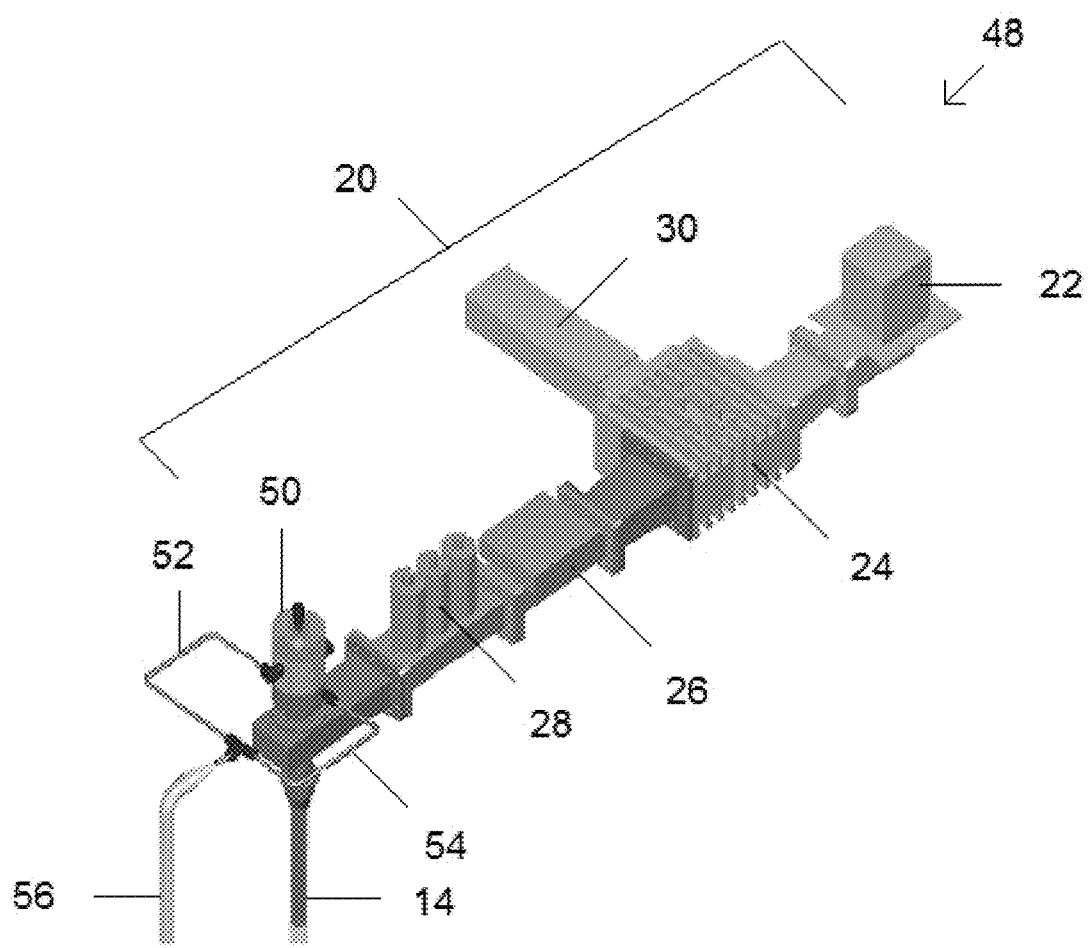
FIG. 3 is a partial schematic representation of a reactor for producing nanostructures according to another embodiment of the present invention.

FIG. 3 is a partial schematic representation of a reactor for producing nanostructures according to another embodiment of the present invention. Reactor 48 includes metal powder and gas delivery system 50, dielectric tube 14, sheath gas lines 52 and 54, sheath gas source 56, and microwave energy generator 20. Microwave energy generator 20 can include, for example, magnetron 22, circulator 24, power detector 26 (e.g., a forward and reflected power detector), tuner 28 (e.g., a three stub tuner), and load 30. In one instance, sheath gas lines 52 and 54 can be configured to deliver a sheath gas and a plasma-forming gas to dielectric tube 14. For example, sheath gas source 56 can be configured to mix and deliver a sheath gas and a plasma-forming gas to sheath gas lines 52 and 54.

Figure 4:
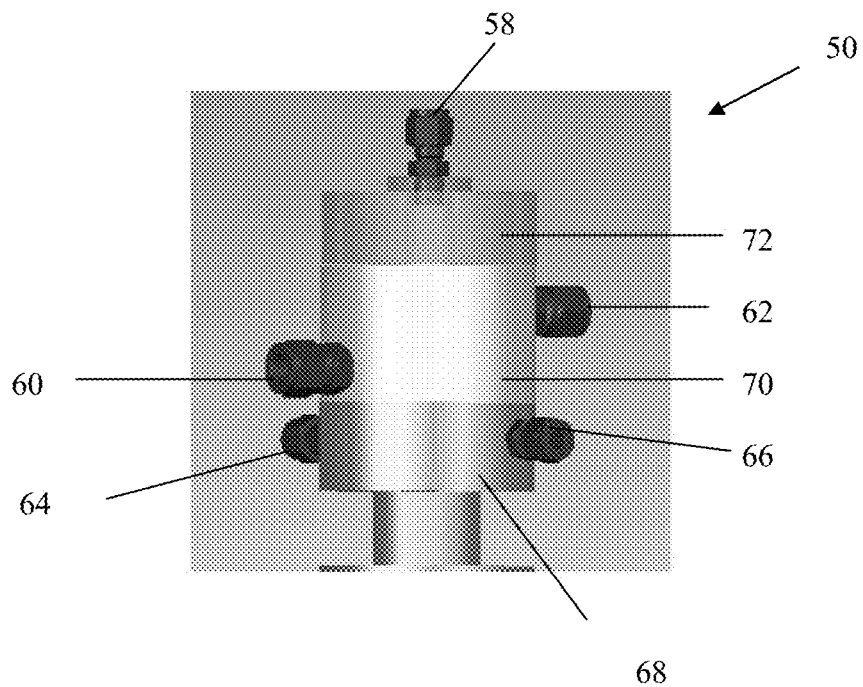
FIG. 4 is a schematic representation of an example of a metal powder and gas delivery system.

FIG. 4 is a schematic representation of an example of a metal powder and gas delivery system. Metal powder and gas delivery system 50 includes plasma-forming gas inlet 58, coolant inlet 60, coolant outlet 62, and sheath gas inlets 64 and 66. In some embodiments, coolant inlet 60 and coolant outlet 62 are for liquid coolant, e.g., cooling water. Metal powder and gas delivery system 50 can include gas delivery system 68, cooling jacket and powder delivery system 70, and cooling jacket cover and plasma-forming gas inlet system 72.

Figure 5A:
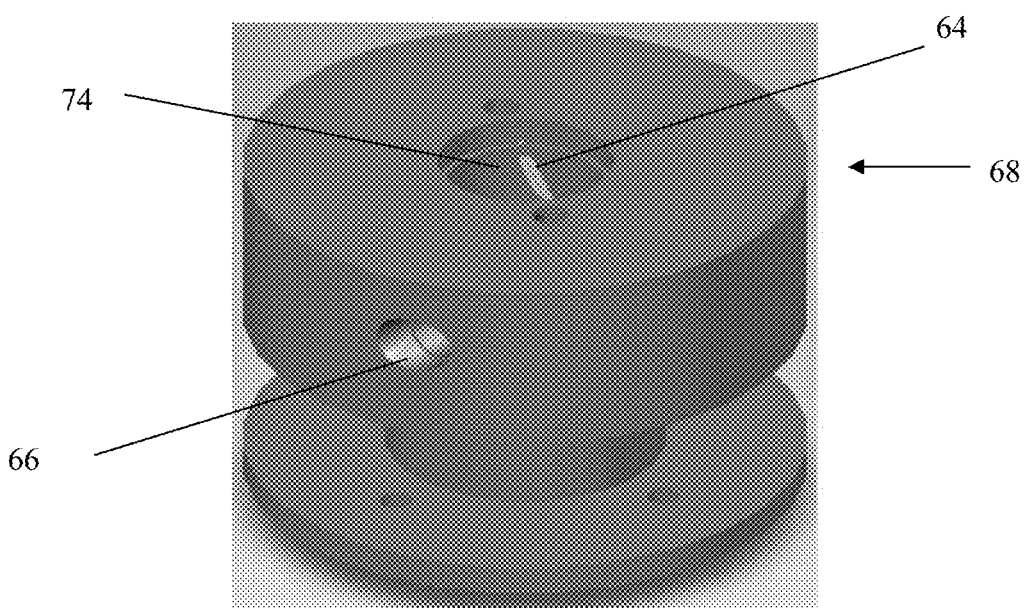
FIGS. 5A to 5C are schematic views of an example of a gas delivery system.
Figure 5B:
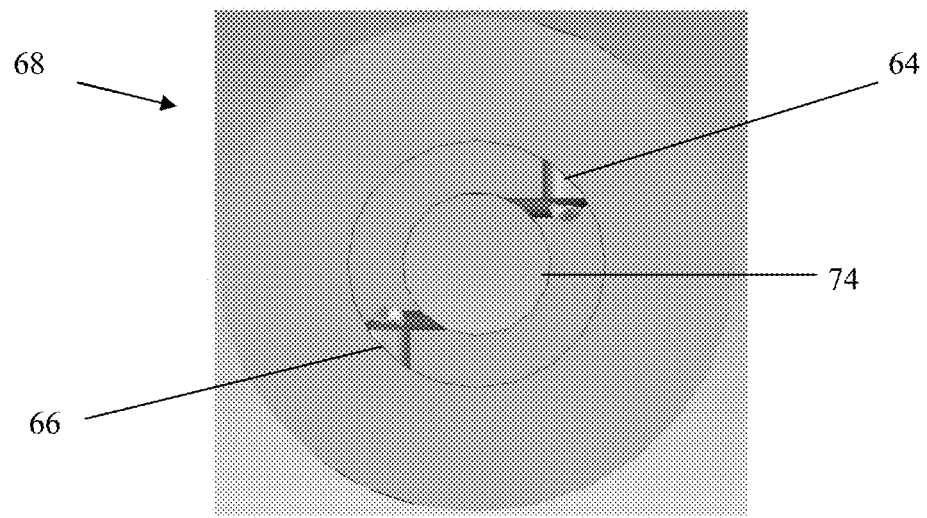
Figure 5C:
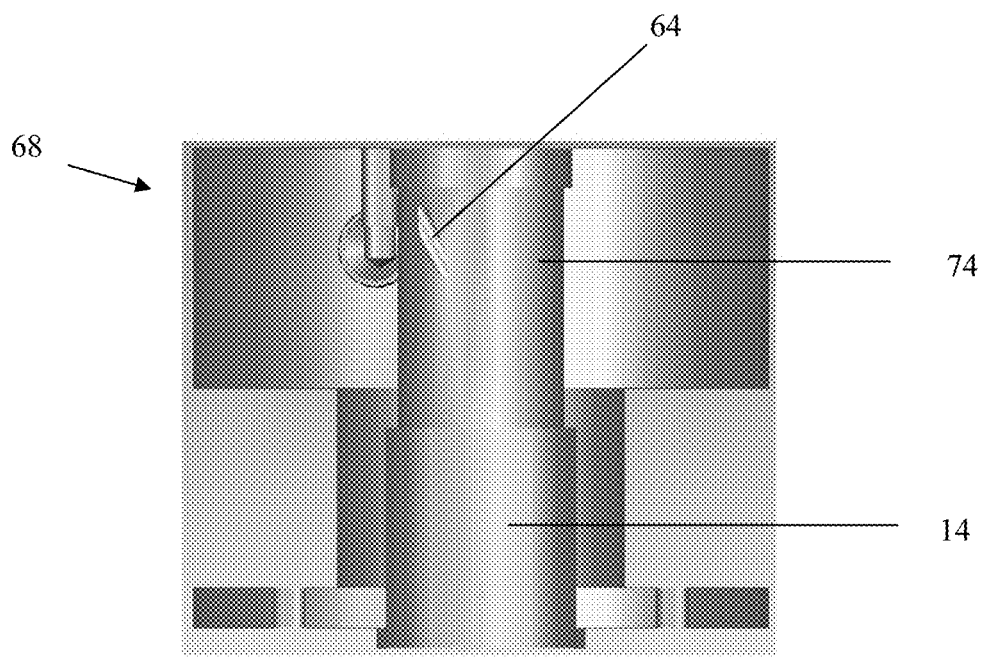

FIGS. 5A to 5C are schematic views of an example of a gas delivery system. Gas delivery system 68 includes sheath gas inlets 64 and 66. FIG. 5A is a trimetric view of gas delivery system 68 showing sheath gas inlets 64 and 66 and central tube 74. Sheath gas inlets 64 and 66 can be configured to deliver sheath gas, plasma-forming gas, or both sheath gas and plasma-forming gas to central tube 74. FIG. 5B is a top view of gas delivery system 68 showing sheath gas inlets 64 and 66 tangential to central tube 74. FIG. 5C is a side view of gas delivery system 68 showing sheath gas inlet 64 at an angle with respect to a longitudinal axis of the dielectric tube. As illustrated, gas inlet 64 is at a 45° angle with respect to the longitudinal axis of dielectric tube 14. In one embodiment, gas delivery system 68 helps to protect the dielectric tube from heat that may result in a high power plasma discharge. For example, by delivering sheath gas via gas delivery system 68, the plasma can be confined near the center of the tube and contact of the plasma with the dielectric tube can be avoided and also peripherally-located sheath gas can minimize or prevent transmission of heat from the plasma to the dielectric tube.

Figure 6A:
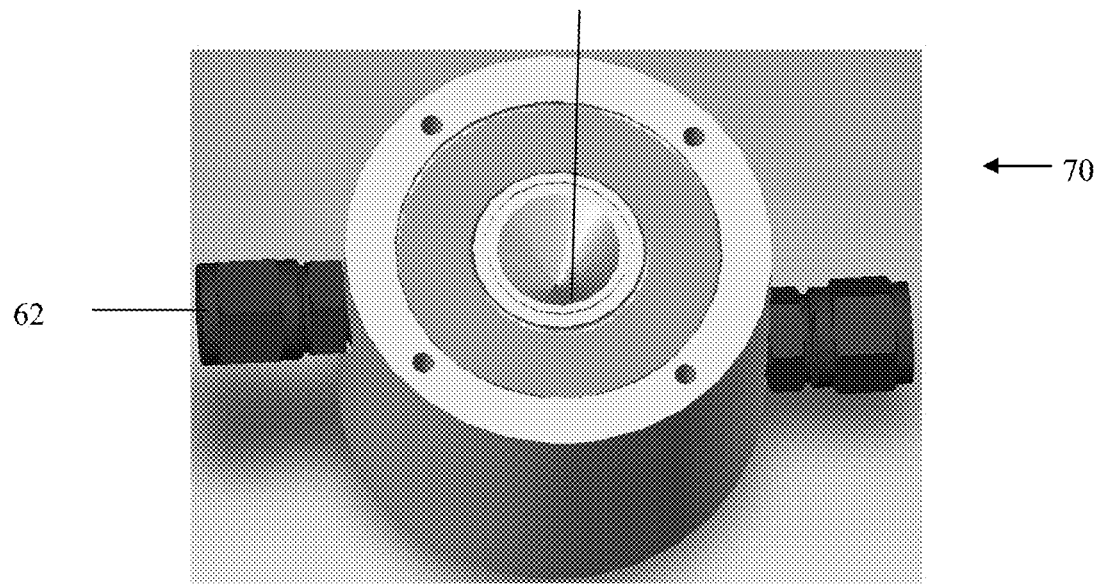
FIGS. 6A and 6B are schematic views of an example of a cooling jacket and powder delivery system.
Figure 6B:
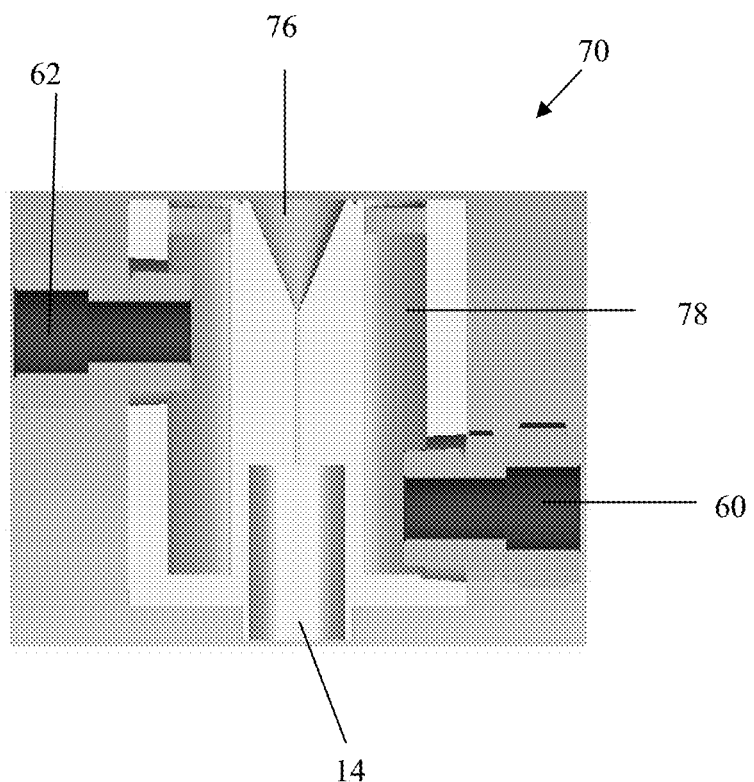

FIGS. 6A and 6B are schematic views of an example of a cooling jacket and metal powder delivery system 70. FIG. 6A is a trimetric view and FIG. 6B is a cross-sectional view of the cooling jacket and metal powder delivery system 70. Cooling jacket and metal powder delivery system 70 can include coolant inlet 60 and coolant outlet 62. In some embodiments, coolant inlet 60 and coolant outlet 62 are for liquid coolant, e.g., cooling water. Cooling jacket and powder delivery system 70 can also include conical funnel 76 through which powder can be made to flow into dielectric tube 14. In other embodiments, a cooling jacket and metal powder delivery system can include a non-conical funnel such as, for example, a pyramidal funnel. Cooling jacket and metal powder delivery system 70 includes cooling jacket 78 wherein coolant can circulate to reduce or maintain temperature in the metal powder delivery system 70.

Figure 7:
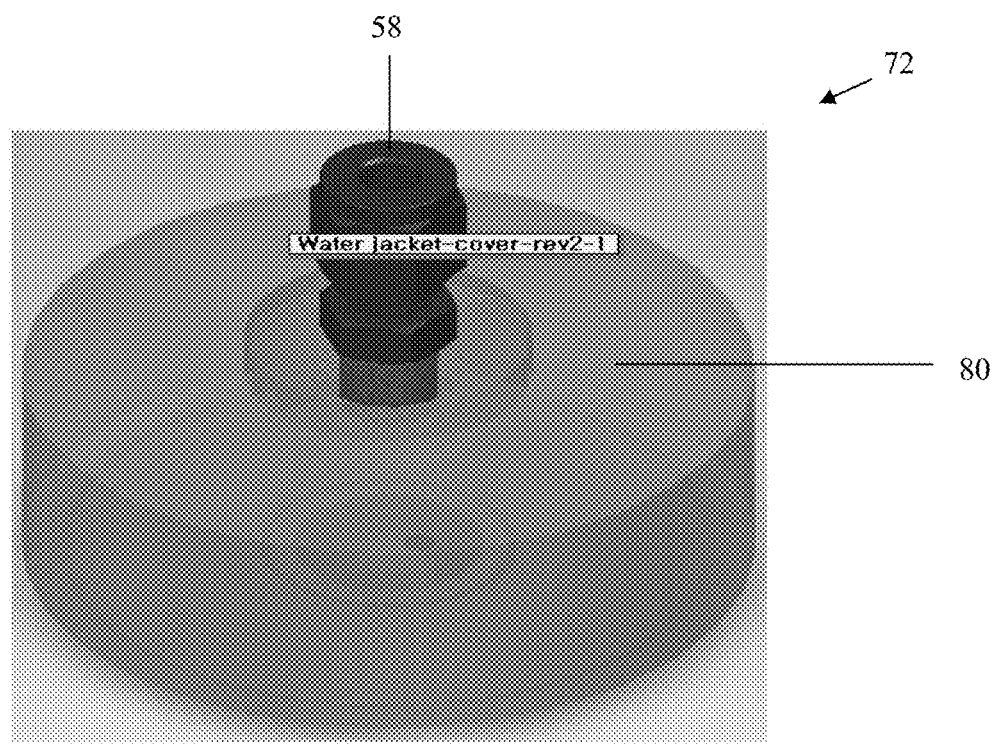
FIG. 7 is a schematic view of an example of a cooling jacket cover and plasma-forming gas inlet system.

FIG. 7 is a schematic view of an example of a cooling jacket cover and plasma-forming gas inlet system. Cooling jacket cover and plasma-forming gas inlet system 72 can include cooling jacket cover 80 and plasma-forming gas inlet 58. Plasma-forming gas inlet 58 can be configured to deliver plasma-forming gas substantially longitudinally into the dielectric tube. In one embodiment, cooling jacket cover 80 is transparent to permit viewing of the metal powder during feeding of the metal powder to metal powder and gas delivery system 50 (shown in FIG. 3).

Figure 8:
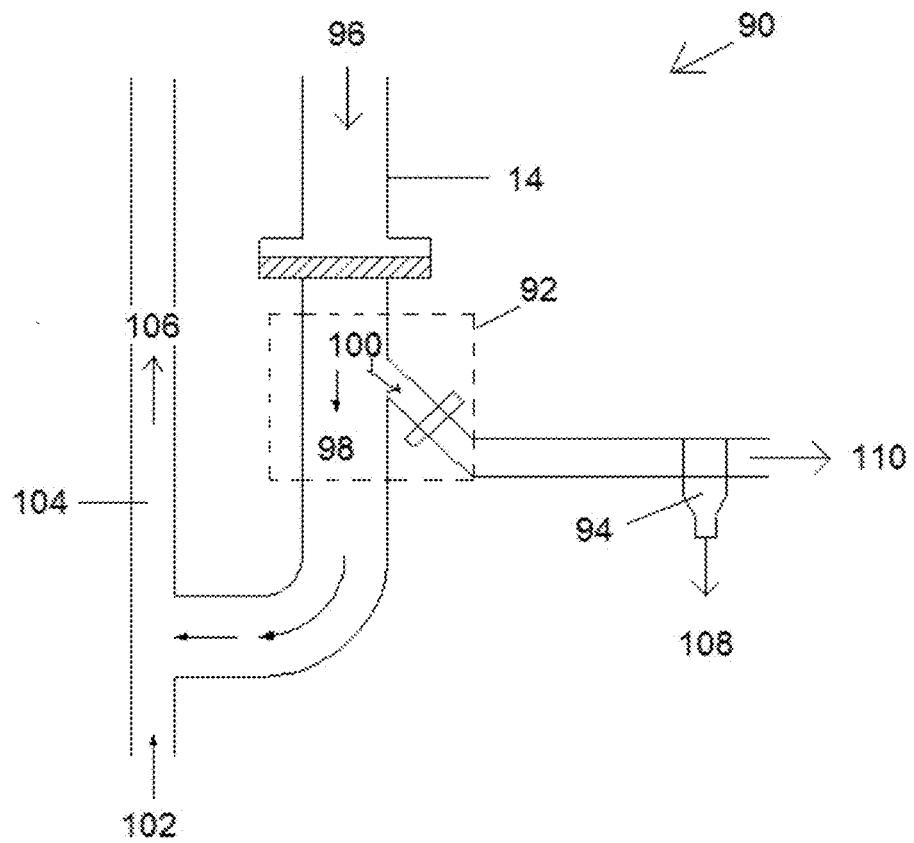
FIG. 8 is a partial schematic representation of an example of a recycle system in communication with a dielectric tube.

FIG. 8 is a partial schematic representation of an example of a recycle system 90 in communication with dielectric tube 14. Partial recycle system 90 includes tee 92 and separator 94. During operation, reaction product stream 96 is separated in two parts through tee 92. Reaction product stream 96 is split into heavy particle stream 98 and fine particle stream 100. Heavier and mostly unreacted particles are directed downwards where they are entrained by high velocity gas 102. High velocity gas 102 flowing through a small diameter tube 104 can entrain the lower velocity particles of heavy particle stream 98 to form entrained particle stream 106. Entrained particle stream 106 can be in communication with plasma-forming gas inlet 58, shown in FIGS. 4 and 7. Fine particle stream 100 can be in communication with a separator 94 such as, for example, a cyclone separator, wherein product stream 108 is collected and exhaust gases 110 are removed.

Figure 9:
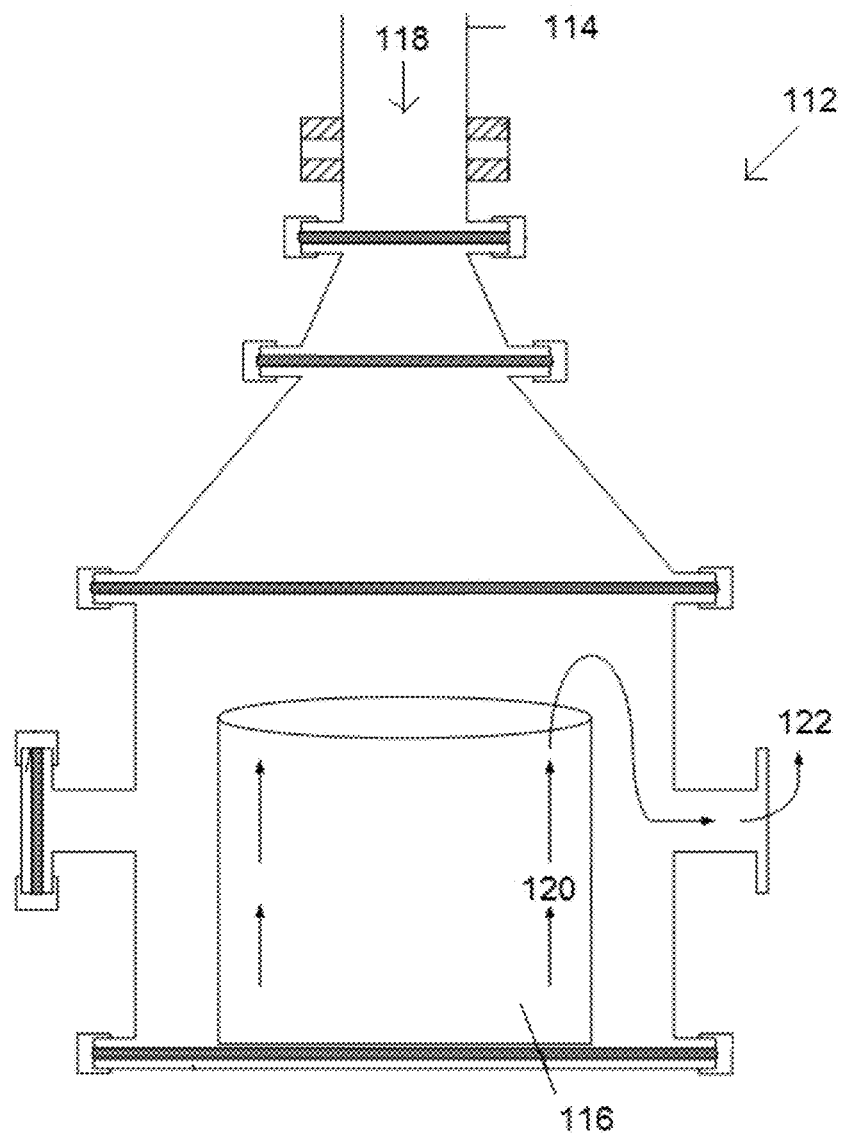
FIG. 9 is a schematic representation of an example of a nanostructure product collector.
Figure 10A:
FIGS. 10A to 10E are photomicrographs of tin oxide nanowires produced from tin metal powder according to one embodiment of the invention and as described in Example 1.
Figure 10B:
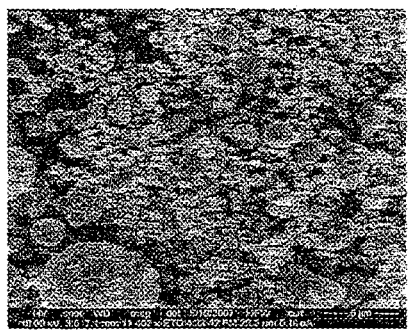
Figure 10C:
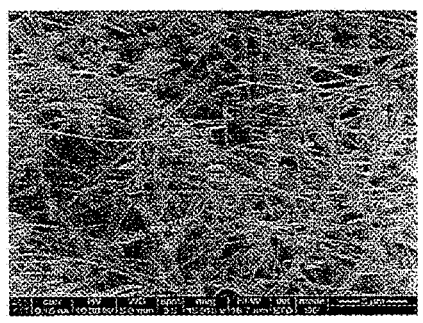
Figure 10D:
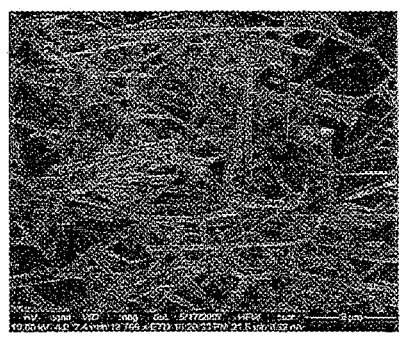
Figure 10E:
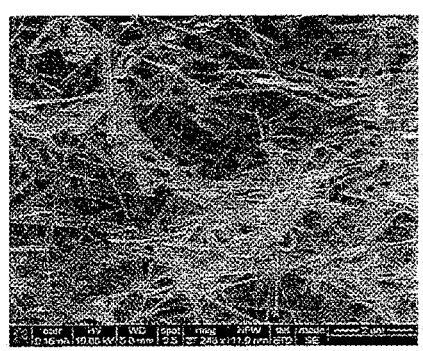

FIG. 9 is a schematic representation of an example of a nanostructure product collector. The nanostructure product collector 112 is in communication with dielectric tube 114 and includes powder collecting cup 116. In one embodiment, powder collecting cup 116 is made of quartz. During operation, reaction product stream 118 flows from dielectric tube 114 and into powder collecting cup 116. The reaction products can settle in powder collecting cup 116 and exhaust gas 120 can flow out through exhaust 122.

Figure 20:
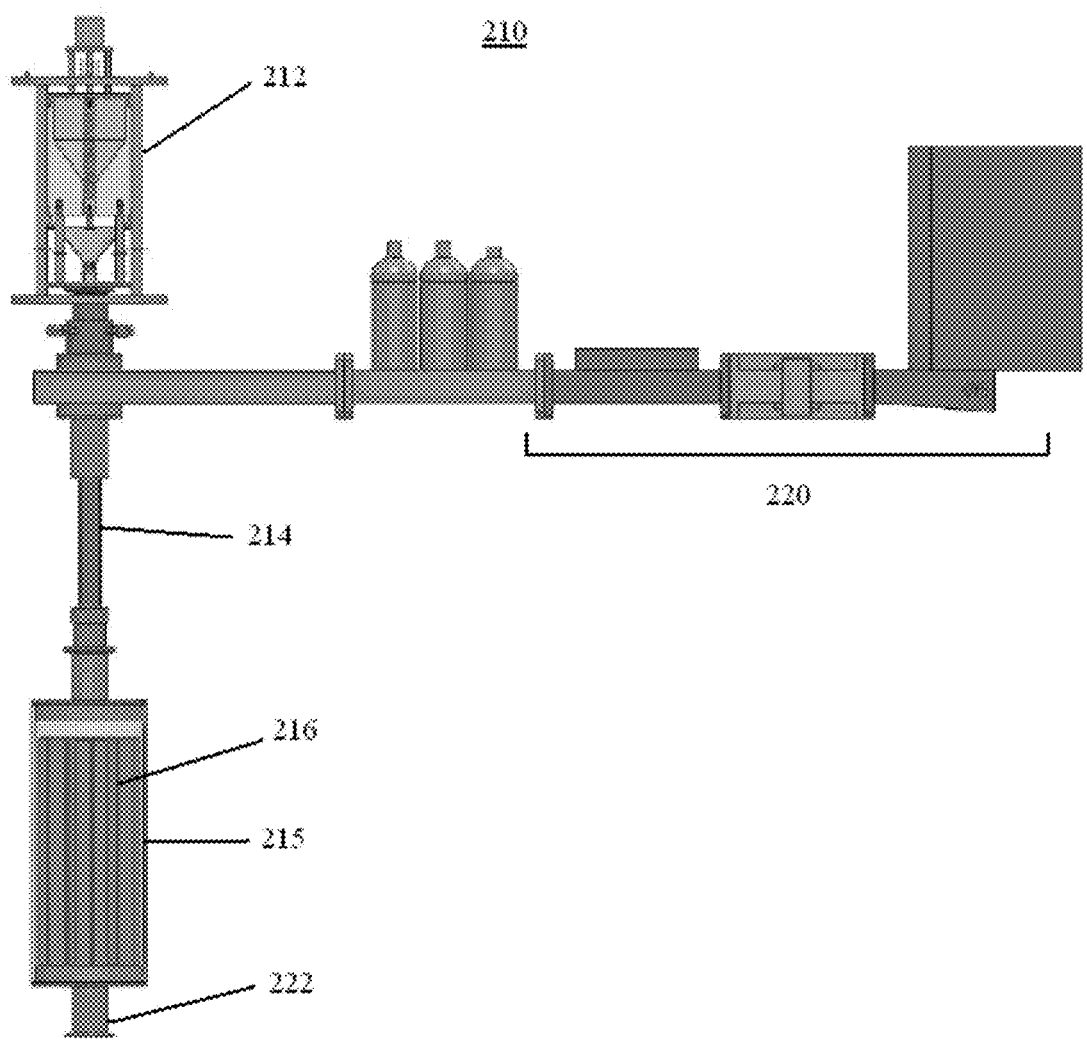
FIG. 20 is a schematic representation of a reactor comprising a product collector having a filter according to a further embodiment of the present invention.

Referring now to FIG. 20, in another embodiment of the present invention, a reactor 210 is provided that comprises a regulated metal powder delivery system 212, a microwave energy generator 220, a dielectric tube 214, and a product collector 215 that has a filter 216 and an exhaust 222. Among other things, the filter 216 and exhaust 222 are configured so that the reactor 210 has a relatively smooth air flow and a low pressure drop. Smooth air flow and low pressure drops reduce the potential for disruptions to the plasma jet or the flow characteristics of the metal powder, which minimizes the negative impacts on nanoparticle and nanowire characteristics that may be attributed to such disruptions.

Figure 22:
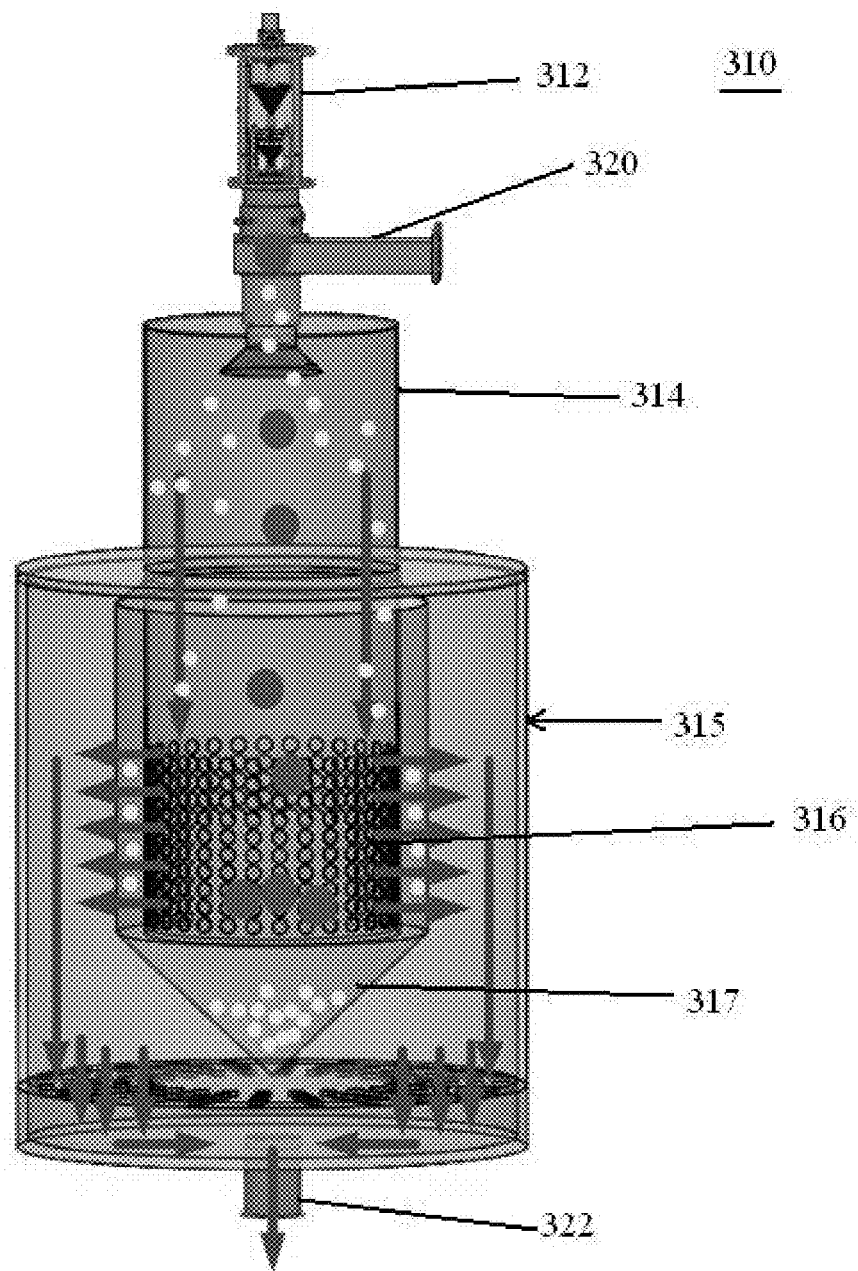
FIG. 22 is a schematic representation of a reactor comprising a product collector having a filter according to a further embodiment of the present invention, where small circles represent nanowires, larger circles represent unreacted particles, triangles represent raw metal powder, and air flow is represented by arrows.

Referring now to FIG. 22, in yet another embodiment of the present invention, a reactor 310 is provided that includes a regulated metal powder delivery system 312 and a product collector 315 that has a filter 316 arranged so that surface of the filter 316 is perpendicular to a longitudinal direction of the dielectric tube 314. As shown in FIG. 22, the filter 316 is arranged cylindrically around, for example, a cylindrical wire structure, and the side of the filter 316 opposing the dielectric tube 314 further comprises a filter bag 317. The filter bag 317 is configured to gather nanostructures that do not pass through and do not adhere to the filter 316, for example. Such embodiments allow for relatively large filter 16 surface areas, which also can contribute to smooth air flow and low pressure drop. In such embodiments, nanoparticles or nanowires that are produced by the reactor 310 can collect either on the surface of the vertical filter 316 or fall from the filter 316 into the filter bag 317. The filtered air can then exit the product collector 315 via an exhaust 322.

Of course, the surface of a filter may be configured at any angle relative a longitudinal direction of the dielectric tube. For example, in the exemplary embodiment shown in FIG. 22, the cylindrical filters are arranged perpendicularly to a longitudinal direction from the dielectric tube so that the surface of the filters are parallel to the longitudinal direction from the dielectric tube. In some embodiments, the filter surface is perpendicular to a longitudinal direction of the dielectric tubes. In other embodiments, the filter is angled with respect to a longitudinal direction of the dielectric tube by about 10%, about 20%, about 30%, about 40%, about 50%, about 60%, about 70%, or about 80%. In some embodiments, the product collectors including the filters can also include other collection mechanisms, such as collection cups, traps, and the like to further assist in collecting the nanostructures.

The filters used in accordance with the present invention can be comprised of any material suitable for filtering and collecting metal oxide nanoparticles and nanowires. One of skill in the art will appreciate that different materials will affect air flow and pressure drop within a reactor to varying degrees. Non-limiting examples of filters include high-efficiency particular air filters made of, for example, paper, glass fibers, polymer fibers, and the like. Filters be of any shape, and may be planar, cylindrical, or tubular, for example, and may have any surface shape, such as a ridged shape, a grooved shape, or a smooth shape.

Additionally with regard to the dimensions of a product collector, the filter, and the exhausts of the reactors of the present invention, product collectors, filters, and exhausts having various shapes and sizes can be used in accordance with the presently-disclosed subject matter, and can be selected for a particular application as desired. In certain embodiments, the product collector is a cylinder with a diameter of about 5 inches to about 25 inches and a length of about 10 inches to about 50 inches. In some embodiments, the filter is configured in a cylindrical fashion with a diameter ranging from about 2 inches to about 12 inches a length ranging from about 8 inches to about 48 inches. In certain embodiments, the reactors comprise an exhaust of any dimension that insures proper dynamics within the reactor. In some embodiments, the exhaust comprises a diameter of about 1 to about 2 inches.

In one aspect, the present invention also includes a reactor for forming nanostructures from a precursor such as, for example, a metal organic precursor or a carbon nanotube precursor. For example, a reactor for producing nanostructures from a precursor can comprise: a precursor delivery system, wherein the precursor delivery system includes a funnel in communication with a dielectric tube; a plasma-forming gas inlet also in communication with the dielectric tube, whereby a plasma-forming gas is delivered substantially longitudinally into the dielectric tube; a sheath gas inlet also in communication with the dielectric tube, whereby a sheath gas is delivered into the dielectric tube; and a microwave energy generator coupled to the dielectric tube, whereby microwave energy is delivered into the dielectric tube and to the plasma-forming gas. Suitable components and configuration for such a reactor are described supra with respect to the reactor for producing metal oxide nanostructures. In one embodiment, the precursor delivery system can be substantially the same as the metal powder delivery system described herein.

The present invention also includes a method for producing metal oxide nanostructures. In some embodiments, the method includes providing a reactor comprising a metal powder delivery system, a dielectric tube, and a product collector that comprises a filter; delivering a plasma-forming gas substantially longitudinally into a dielectric tube; delivering a sheath gas into the dielectric tube; forming a plasma from the plasma-forming gas by applying microwave energy to the plasma-forming gas; delivering a metal powder into the dielectric tube; reacting the metal powder within the plasma to form metal oxide nanostructures; and collecting the metal oxide nanostructures.

As used herein, the terms "provide," "providing," and the like refer to obtaining a reactor, manufacturing a reactor, or offering a reactor. Thus, in one embodiment, providing refers to a person or entity obtaining a reactor to form nanostructures. In some embodiments, providing refers to a person or entity manufacturing a reactor that can make nanostructures. In still further embodiments, providing refers to a person or entity offering a reactor to be used. In some embodiments, the step of providing a reactor refers to selecting a particular reactor to be used.

The methods for producing metal oxide nanostructures described herein involve the production of nanostructures directly in the vapor phase without the need for any catalyst, substrate, or template. Nanostructures can be formed of metal oxides such as, for example, tin oxide, zinc oxide, tungsten oxide, titanium dioxide, iron oxide, gallium oxides, indium oxides, bismuth oxides, niobium pentoxide, aluminum oxides, vanadium pentoxide, cooper oxides, alloy oxides, and the like, and combinations thereof, by using the appropriate metal feed. The methods and reactor described herein can also be used to produce sulfide and nitride nanostructures using, for example, an appropriate gas-phase chemistry feed. In addition, carbon nanotubes (CNT) can be formed using the methods and reactor described herein, for example, using iron and hydrocarbon species in a vapor phase feed.

A method for producing metal oxide nanostructures can include delivering a plasma-forming gas into a dielectric tube. In one embodiment, a method for producing metal oxide nanostructures includes delivering a plasma-forming gas substantially longitudinally into a dielectric tube. Delivering the plasma-forming gas substantially longitudinally into a dielectric tube can help to keep the plasma centered in the dielectric tube. In some embodiments, the plasma-forming gas is delivered in a helical gas path into the dielectric tube. The plasma-forming gas can include, for example, argon gas. The plasma-forming gas can also include an oxidative gas such as oxygen. In some instances, the plasma-forming gas can include water vapor. In some embodiments, the plasma-forming gas can include hydrogen gas.

In some embodiments, the plasma-forming gas is delivered into the dielectric tube at a flow rate of less than about 10 slpm, for example, about 1 to about 5 slpm, about 2 to about 4 slpm, or about 2 slpm. In one embodiment, the diameter of the dielectric tube is about 22 mm in diameter, thus, in some embodiments, the plasma-forming gas is delivered into the dielectric tube to produce a plasma-forming gas velocity within the dielectric tube of less than about 26.3 meters/min (m/min), for example, about 2.6 to about 13.2 m/min, about 5.3 to about 10.5 m/min, or about 5.3 m/min at standard conditions. In some instances, the plasma-forming gas is delivered into the dielectric tube to produce a plasma-forming gas velocity within the dielectric tube of less than about 30 m/min, for example, about 2 to about 15 m/min, about 5 to about 10 m/min, or about 5 m/min at standard conditions. The plasma-forming gas can include an oxidative gas such as, for example, oxygen gas. In some embodiments, an oxidative gas is delivered into the dielectric tube at a flow rate of equal to or less than about 500 sccm, for example, about 10 to about 500 sccm, 20 to about 400 sccm, 30 to about 300 sccm, about 50 to about 200 sccm, about 75 to about 150 sccm, 50 to about 150 sccm, or about 100 sccm. In one embodiment, the diameter of the dielectric tube is about 22 mm in diameter, thus, in some embodiments, the oxidative gas is delivered into the dielectric tube to produce a oxidative gas velocity within the dielectric tube of less than about 1.3 m/min, for example, about 0.03 to about 1.3 m/min, about 0.1 to about 0.5 m/min, about 0.2 to about 0.4 m/min, or about 0.26 m/min at standard conditions. In some instances, the oxidative gas is delivered into the dielectric tube to produce an oxidative gas velocity within the dielectric tube of less than about 2 m/min, for example, about 0.01 to about 1.5 m/min, about 0.1 to about 0.5 m/min, or about 0.2 to about 0.4 m/min at standard conditions.

Suitable dielectric tubes for use in the method are described supra. In one particular embodiment, the dielectric tube is made of quartz.

A method for producing metal oxide nanostructures can further include delivering a sheath gas into the dielectric tube. Use of a sheath gas can allow the operation of a plasma inside the dielectric tube for extended periods of time. The sheath gas can include, for example, air or nitrogen. In one particular embodiment, the sheath gas is air. The sheath gas can be delivered into the dielectric tube to form a helical sheath gas path. A helical sheath gas path in the dielectric tube can help to contain the plasma and keep the dielectric tube cool during operation of the reactor. Examples of suitable apparatus for producing a helical sheath gas path are described supra.

In some embodiments, the sheath gas is delivered into the dielectric tube at a flow rate of less than about 10 slpm, for example, about 1 to about 8 slpm, about 3 to about 6 slpm, about 4 to about 5 slpm, or about 5 slpm. In one embodiment, the diameter of the dielectric tube is about 22 mm in diameter, thus, in some embodiments, the sheath gas is delivered into the dielectric tube to produce a sheath gas velocity within the dielectric tube of less than about 26.3 m/min, for example, about 2.6 to about 21 m/min, about 7.9 to about 15.8 m/min, about 10.5 to about 13.2 m/min, or about 13.2 m/min at standard conditions. In some instances, the sheath gas is delivered into the dielectric tube to produce a sheath gas velocity within the dielectric tube of less than about 30 m/min, for example, about 1 to about 25 m/min, about 5 to about 20 m/min, or about 10 to about 15 m/min at standard conditions.

In addition, a plasma-forming gas can be delivered to the dielectric tube concurrently with a sheath gas. For example, a plasma-forming gas and a sheath gas can be mixed and delivered into the dielectric tube to form a helical sheath gas path via, for example, angled sheath gas inlets. Alternatively, a plasma-forming gas and a sheath gas can be delivered into the dielectric tube separately to form concurrent helical sheath gas paths via, for example, separate angled gas inlets. Examples of suitable apparatus for producing a helical sheath gas path are described supra.

A method for producing metal oxide nanostructures can further include forming a plasma from the plasma-forming gas by applying microwave energy to the plasma-forming gas. In one particular embodiment, the microwave energy is 2.45 GHz. In some embodiments, the power of microwave energy applied to the plasma-forming gas is less than about 15 kilowatts (kW), less than about 10 kW, or less than 8 kW. For example, the power of microwave energy applied to the plasma-forming gas can be about 300 watts (W) to about 8 kW such as about 500 W to about 2 kW, or about 1 kW to about 1.5 kW. When microwave energy is applied to the plasma-forming gas, a plasma, e.g., a plasma jet, can form in the dielectric tube. In one particular embodiment, microwave energy is delivered to the dielectric tube via a coupler and the microwave energy is used to ignite the plasma. In another embodiment, a metal ignition rod with pointed ends is used to ignite the plasma.

Without being held to any particular theory, it is believed that the metal oxide nanowires are formed under molten conditions and not vaporization conditions, while nanoparticles are formed when the feed metal is vaporized. Under molten conditions, the metal particles are reacted with the plasma at temperatures close to the metal's melting point. The molten metal forms metal oxide nanowires when oxygen reacts with the molten metal. By increasing the microwave power to increase the temperature in the reactor, vaporization conditions favorable to forming metal oxide nanoparticles occur. In other words, at higher temperatures, the metal particles are vaporized into very small nuclei (of a few nanometers) and during their fall in the quartz tube, where the temperature decreases, they begin to condense, form solid metal oxide nanoparticles, and also agglomerate.

Thus, a higher microwave power is needed to form nanoparticles compared to nanowire formation for the same feed metal. For example, to form titanium metal (titania) nanoparticles, the microwave power is required to be greater than about 1000 W, while a microwave power of less than about 1000, and more specifically, about 700 W, is required to form titanium oxide nanowires in the above described reactors. As another example, to form aluminum oxide (alumina) nanoparticles, the microwave power is required to be equal to or greater than about 1300 W, while a microwave power of less than about 1300 W, and more specifically, about 800 W, is required to form aluminum oxide nanowires in the above described reactors.

The gas pressure in the dielectric tube can range, for example, from a few torr to one atmosphere or more. In a specific embodiment, the gas pressure in the dielectric tube ranges from a few torr to about one atmosphere. The length of the plasma can be varied by changing the gas flow rates or by changing the microwave power. In some embodiments, the length of the plasma in the dielectric tube is about 1 to about 30 cm in length. The length of the plasma in the dielectric tube can be varied to alter the production of nanostructures in the plasma. The flame of the plasma can be stabilized by using a stub tuner and by adjusting the gas flow rates. Typically, the gases are introduced to the dielectric tube, the plasma is stabilized and the reflected power is minimized. In one aspect, the present method includes controlling the plasma uniformity inside the dielectric tube by adjusting the microwave power or the gas flow rates. By adjusting the plasma uniformity or length, it is believed that the morphology of the nanostructures and the efficiency of conversion can be adjusted. Generally, longer and more uniform plasmas are preferred.

In some embodiments, the temperatures of the gases in the reactor do not need to be carefully controlled. For example, in one embodiment, no heat insulation is used to cover the dielectric tube or to control the temperature of gases in the dielectric tube. Generally, the reaction of metal powder to metal oxide nanostructures occurs within the plasma and is complete, or substantially complete, upon exiting the plasma so that careful control of the gas temperature outside of the plasma can be unnecessary.

Examples of suitable apparatus for applying microwave energy to a plasma-forming gas are described supra.

In some instances, the plasma-forming gas can include hydrogen gas. In one embodiment, hydrogen gas is mixed with another plasma-forming gas such as argon and then fed to the dielectric tube. In another embodiment, hydrogen gas is concurrently fed to the dielectric tube along with another plasma-forming gas, such as argon. Without being held to any particular theory, it is believed that the introduction of hydrogen gas can reduce the microwave power needed to produce nanowires as compared to the same process which does not use hydrogen gas. It is also believed that hydrogen gas plasma can etch nanoparticles or form nanowires and thereby improve the production efficiency or quality of nanostructures.

In one embodiment, instead of, or in addition to, supplying sheath gas and a plasma-forming gas such as argon to the dielectric tube, water vapor can serve as the plasma-forming gas. For example, steam can be generated and introduced to the dielectric tube, for example, in a helical gas flow pattern. Water splitting into species such as H, O, OH, $H_2$, and $O_2$ and also remaining or forming $H_2O$ can be used to produce high density plasma. In some embodiments, such a plasma can form thinner and higher quality nanostructures due to better etching properties of $H_2$ and OH.

A method for producing metal oxide nanostructures further includes delivering a metal powder (or metal-containing precursor) into the dielectric tube and reacting the metal powder within the plasma to form metal oxide nanostructures. Appropriate metal powders (or metal-containing precursors) can be selected based upon the desired composition of the nanostructures. Examples of metal powders suitable for use in this invention include tin, zinc, tungsten, titanium, iron, gallium, indium, bismuth, niobium, aluminum, vanadium, copper, alloys, and the like, and combinations thereof. In some embodiments, the powder consists of a particle having a particle diameter of less than about 20 microns such as less than about 15 microns, less than about 10 microns, less than about 5 microns, or less than about 1 micron. Generally, relatively small powders result in greater one pass efficiency in the production of nanowires.

In one embodiment, metal powder (or metal-containing precursor) is delivered into the dielectric tube via gravity feed and is conveyed into the plasma by gravity. Alternatively, the metal powder (or metal-containing precursor) can be delivered into the dielectric tube via pressure, e.g., by pressurized gas, or via a mechanical dispensing system. In one embodiment, the metal powder (or metal-containing precursor) is entrained within the plasma-forming gas.

In one embodiment, a bulk of the metal powder (or metal-containing precursor) is delivered substantially into the center of the plasma. For example, the metal powder can be delivered to the dielectric tube via a funnel such as a conical funnel. By using a funnel to deliver the metal powder, the metal powder can be directed into the center of the plasma. In one embodiment, the metal powder is delivered into the dielectric tube via a cooled metal powder delivery system.

Examples of suitable apparatus for delivering a metal powder (or metal-containing precursor) into a dielectric tube are also described supra. For example, an apparatus such as that shown in FIGS. 4, 6A-B, 7, 20, and 22 can be used to deliver a metal powder (or metal-containing precursor) into a dielectric tube. In one embodiment, powder is added to conical funnel 76 of cooling jacket and powder delivery system 70, cooling jacket cover and plasma-forming gas inlet system 72 is placed over cooling jacket and powder delivery system 70, and gas is supplied via plasma-forming gas inlet 58 and used to push the powder through conical funnel 76 into dielectric tube 14.

In one embodiment, the metal powder is delivered into the dielectric tube by a regulated metal powder delivery system. The regulated metal powder delivery system can be regulated by any means, including electric or mechanical means.

In some embodiments, the metal powder delivery system is regulated to deliver metal powder at a predetermined or set flow rate. In some embodiments, the flow rate is regulated to provide about 25 grams/hour, about 50 grams/hour, about 75 grams/hour, about 100 grams/hour, about 150 grams/hour, about 200 grams/hour, about 300 grams/hour, about 400 grams/hour, about 500 grams/hour, about 600 grams/hour, or any value therebetween. In some embodiments, the regulated delivery of metal powder maintains relatively constant conditions within the reactor and reduces potential disruptions to the plasma to thereby produce metal oxide nanostructures have relatively uniform characteristics.

In one embodiment, wherein a portion of the metal powder delivered to the dielectric tube does not react to form metal oxide nanostructures, the method of the present invention further includes separating nanostructures from a stream of nanostructures and unreacted metal powder. Examples of suitable apparatus for separating nanostructures from a stream of nanostructures and unreacted metal powder are described supra.

In one embodiment of the invention, wherein a portion of the metal powder delivered to the dielectric tube does not react to form metal oxide nanostructures, the method of the present invention further includes recycling unreacted metal powder into the plasma. In some embodiments, fresh metal powder feed can be added to the recycled metal powder before feeding the combined stream into the plasma. By recycling unreacted metal powder back to the plasma, efficiency of the process can be enhanced, waste materials can be reduced, continuous production of nanostructures can be achieved, and purity of the nanostructure product can be increased.

Examples of suitable apparatus for recycling unreacted metal powder into the plasma are described supra.

In one embodiment, a precursor feed can be added to the reaction product stream downstream of the plasma for further reaction. For example, a precursor feed can be added downstream of the plasma to promote thin film formation.

In one particular embodiment, production of metal oxide nanostructures is conducted at less than about 1000 W of plasma power in an atmosphere of about 5 slpm, about 2 slpm argon, and about 100 sccm oxygen. Metal powder or granules are allowed to fall under gravity through a plasma jet in a quartz tube, the metal granules are melted to form metal oxide nanowires, and the metal oxide nanowires are collected from the bottom of the dielectric tube.

In another particular embodiment, production of metal oxide nanoparticles is conducted at equal to or greater than about 1000 W of plasma power in an atmosphere of about 5 slpm, about 2 slpm argon, and about 100 sccm oxygen. Metal powder or granules are allowed to fall under gravity through a plasma jet in a quartz tube, the metal granules are vaporized within the plasma to form metal oxide nanoparticles, and the metal oxide nanoparticles are collected from the bottom of the dielectric tube.

In one embodiment, a method for producing nanostructures further includes delivering a precursor, e.g., a metal organic precursor such as a carbon nanotube precursor, into the dielectric tube and reacting the precursor within the plasma to form nanostructures. In each instance of the present disclosure, a metal-containing precursor such as a metal-containing organic precursor such as a carbon nanotube precursor, can be substituted for the metal powder in a reactor and method to form nanostructures from the precursor. For example, in some aspects, the present invention includes a method for producing nanostructures comprising: delivering a plasma-forming gas substantially longitudinally into a dielectric tube; delivering a sheath gas into the dielectric tube; forming a plasma from the plasma-forming gas by applying microwave energy to the plasma-forming gas; delivering a precursor into the dielectric tube; and reacting the precursor within the plasma to form nanostructures. The precursor can include a metal organic precursor such as a carbon nanotube precursor, e.g., an iron and hydrocarbon species in a vapor phase feed.

In some embodiments, a method for producing metal oxide nanostructures further includes the step of collecting the metal oxide nanostructures. As used herein, the term "collect," "collecting," and the like refer to recovering nanostructures from a reactor. In certain embodiments, collecting refers to recovering formed nanostructures from the dielectric tube, a product collector, a filter in a product collector, a collecting cup, or any other portion of the reactor or elements attached thereto. Collection can be achieved by, among other things, scraping, scooping, vacuuming, or lifting the nanostructures. In one embodiment, collecting refers to recovering nanostructures from a filter that is located in a product collector. In one embodiment, collecting refers to recovering nanostructures from a filter bag that is configured to hold nanostructures that are gathered by, but do not adhere to, a filter. For example, with reference to FIG. 22, in some embodiments, the nanostructures can be collected from a filter 316 or a filter bag 317 that is located within a product collector 315. In some embodiments, the nanostructures are collected from two or more locales within the reactor or elements attached to the reactor. For example, in some embodiments, the nanostructures can be collected from both the product collector and the dielectric tube.

In some embodiments of the present invention, the nanostructures themselves can differ in structure depending on the manner and location in which they are collected. For example, as shown in FIGS. 21A to 21C, FIGS. 21D to 21E, and FIGS. 21F to 21I, respectively, the structure of the nanostructures can differ depending on whether the nanostructures are collected from a dielectric tube, from a filter, or from a collecting cup.

In some embodiments, nanostructures collected from a filter have higher aspect ratios than nanostructures collected from other parts of a reactor. For example, in some embodiments, metal powder (e.g., microparticles) having a diameter of about 1 μm to about 45 μm can be delivered by a regulated metal powder delivery system to the dielectric tube of a reactor and exposed to a plasma having a power of about 1 kW to about 2 kW, an $O_2$ flow rate of 2.5 lpm, and an $N_2$ flow rate of about 12.5 lpm to produce nanostructures that can be collected from a filter located in the product collector and have a diameter of about 15 nm to about 30 nm and a length of about 100 μm, as compared to nanostructures that can be collected from the dielectric tube or other parts of the reactor and have a diameter of about 20 nm to about 100 nm and a length of about 1 μm to about 10 μm.

In one aspect, the method for producing nanostructures further includes depositing nanostructures in a thin film or in an array onto a suitable substrate, for example, using downstream plasma oxidation of metal film coated substrates or metal substrates.

The methods and apparatus described herein can be used in both batch and continuous processes for the production of nanostructures. In one embodiment, nanostructures are deposited on the sides of a dielectric tube and, after operation of the reactor for a period of time, the nanostructures are recovered from the sides of the dielectric tube. In other embodiments, nanostructures are continuously collected from the reactor during its operation.

The methods for producing nanowires described herein can be performed individually, in parallel with other nanostructure production processes, or in series with other nanostructure production processes. For example, in one embodiment, the products from one nanostructure production process can be fed to another nanostructure production process to form a continuous production route.

The reactor and methods of the present invention can be used to produce highly pure nanostructure products. In some embodiments, the nanostructure products do not contain any foreign material contamination such as, for example, catalyst, substrate, or template materials. In particular embodiments, the nanostructure products contain less than about 5%, less than about 1%, less than about 0.5%, less than about 0.1%, less than about 0.01%, or less than about 0.001% by weight foreign material contamination. For example, the nanostructure products can contain at least about 99%, at least about 99.9%, at least about 99.99%, or at least about 99.999% metal oxide by weight. In some preferred embodiments, highly pure nanostructure products are produced without additional purification or separation of the nanostructure products exiting the reactor.

EXAMPLES

The metal oxide nanowires of Examples 1 to 4 and 6 were produced using the reactor illustrated in FIGS. 1-2 but without recycling system 38. The reactor was operated at 1000 watts (W) in an atmosphere of 5 standard liters per minute (slpm) air sheath gas (fed through sheath gas inlets 16 and 18), and a plasma-forming gas of 2 slpm argon and 100 standard cubic centimeters per minute (sccm) of oxygen (fed through metal powder and plasma-forming gas delivery system 12) at atmospheric pressure. A metal ignition rod with pointed ends was used to ignite the plasma. The metal powder or the metal-containing precursor was supplied to the top of the dielectric tube into a microwave plasma jet. Gases and metals reacted at the center of the dielectric tube near the plasma flame head and simultaneously fell under gravity along the plasma flame length. The plasma flame length was about 10 centimeters in length. The dielectric tube was quartz and had a length of about 75 cm and an inside diameter of about 22 millimeters (mm) (about 25 mm outside diameter). Metal oxide nanowires were collected from the bottom of the dielectric tube. The efficiency of nanowire production was about 80 to 90% using about 100 nanometer (nm) diameter metal powder or granules but was less than 20% when metal granules with sizes greater than about 10 microns were used.

Example 1

Tin granules (separately, less than about 10 microns (tin powder, spherical, <10 microns, 99%, Catalog No. 520373 from Sigma Aldrich) and then greater than about 100 nm (tin powder, APS approx. 0.1 micron, Catalog No. 43461 from Alfa Aesar)) were allowed to fall under gravity through the plasma jet in the quartz tube and nanowires were collected from the bottom of the tube. The obtained nanowires were tin oxide and had diameters ranging from about 50 to about 500 nanometers and lengths of about 1 to about 10 microns.

The products obtained using the two different tin metal diameter precursors (about 10 micron and about 100 nm) under the same operating conditions were imaged using SEM. The about 100 nm metal produced more uniform nanowires and about 90% conversion efficiency. The about 10 micron metal had less conversion efficiency (20-30%)

and produced less uniform nanowires. Thus, smaller metal powders appeared to produce better results than larger metal powders.

Figure 11:
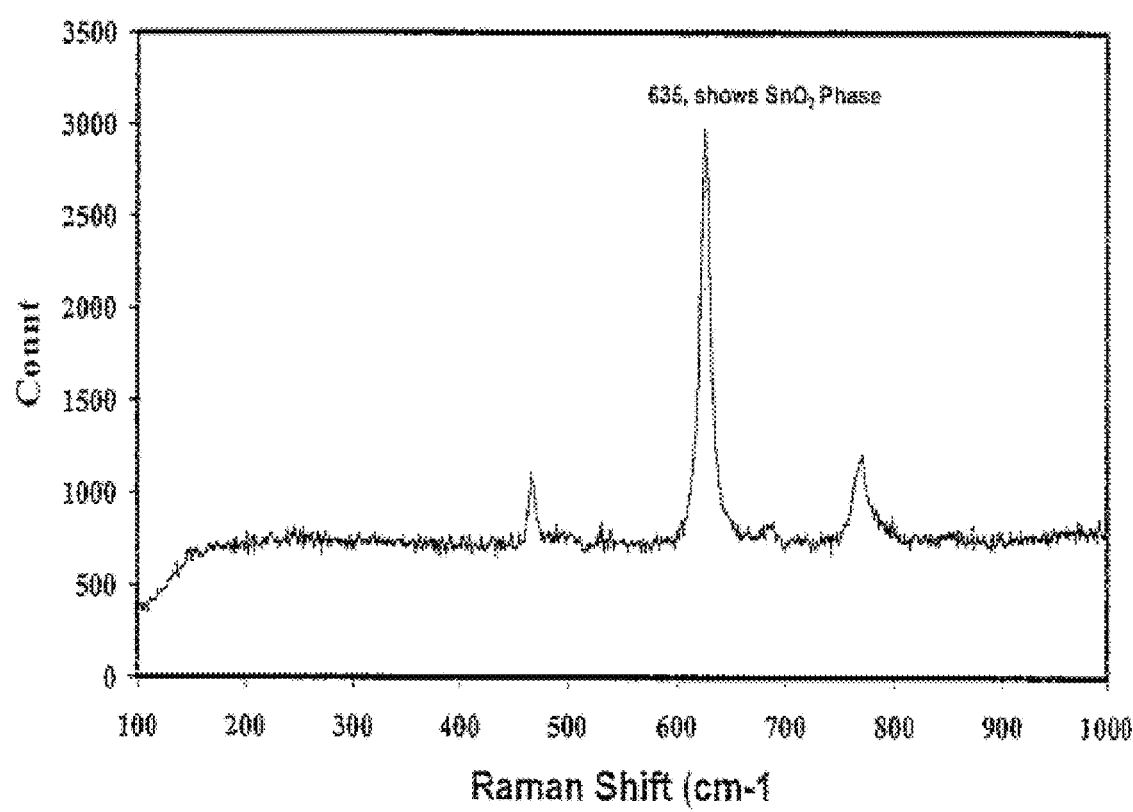
FIG. 11 is a Raman spectrum of tin oxide nanowires produced from tin metal powder according to one embodiment of the invention and as described in Example 1.

FIGS. 10A to 10E are photomicrographs of the tin oxide nanowires produced. The obtained nanowires had diameters ranging from about 50 to about 500 nanometers and lengths of about 5 to about 10 microns. Nanobeads were also observed as shown in one of the photomicrographs. FIG. 11 is a Raman spectrum of the tin oxide nanowires.

Example 2

Zinc metal powder or granules (<50 nm particle size, 99+%, Catalog No. 578002 from Sigma Aldrich) (observed to be greater than 100 nm under SEM) were allowed to fall under gravity through the plasma jet in the quartz tube and nanowires were collected from the bottom of the tube. The obtained nanowires were zinc oxide and had diameters ranging from about 100 to about 500 nm and lengths of about 1 to about 10 microns.

Figure 12A:
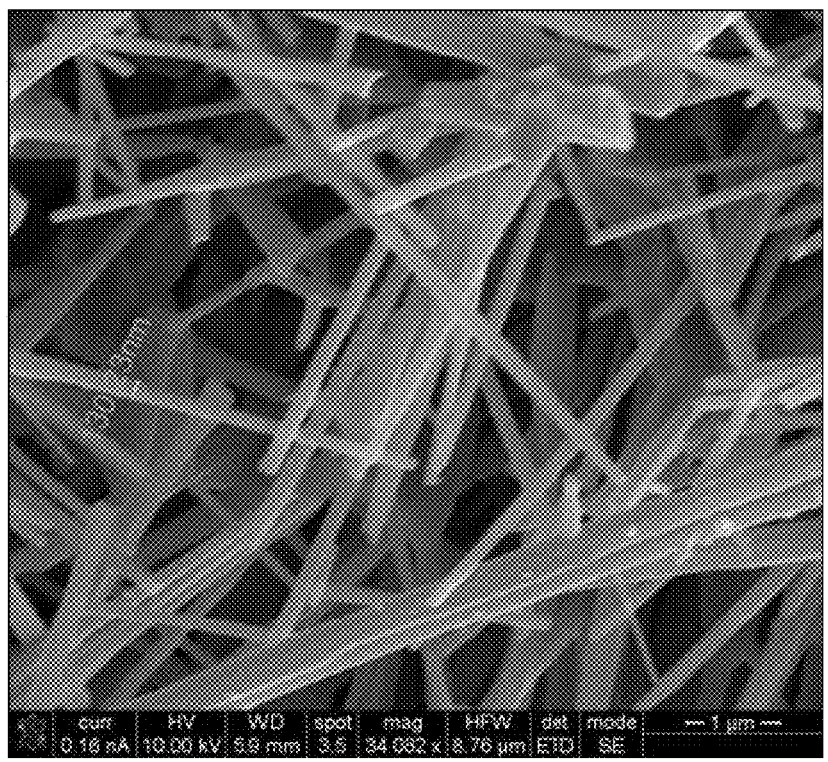
FIGS. 12A to 12F are photomicrographs of zinc oxide nanowires produced from zinc metal powder according to one embodiment of the invention and as described in Example 2.
Figure 12B:
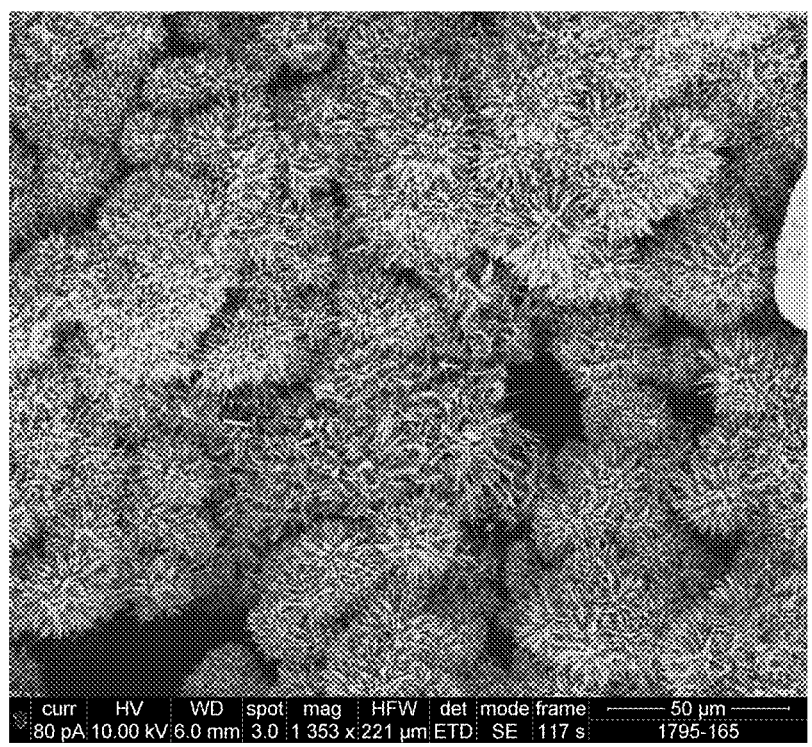
Figure 12C:
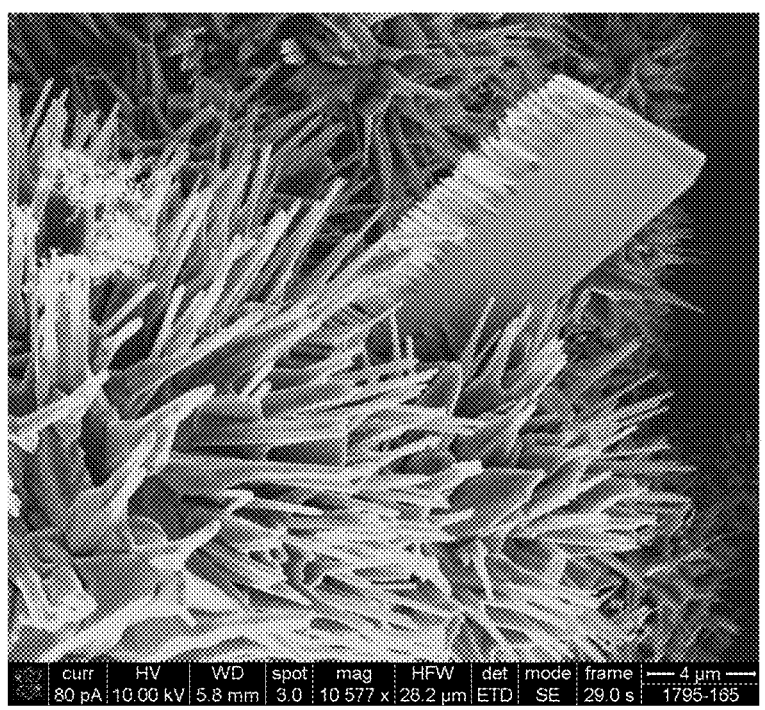
Figure 12:
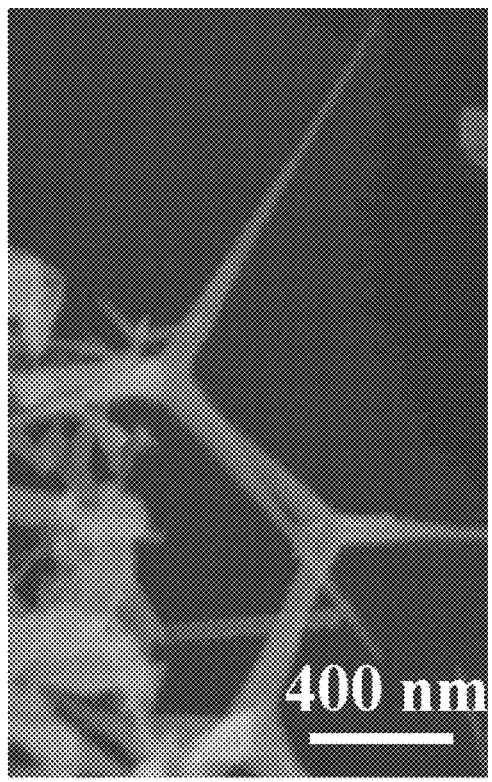
Figure 12E:
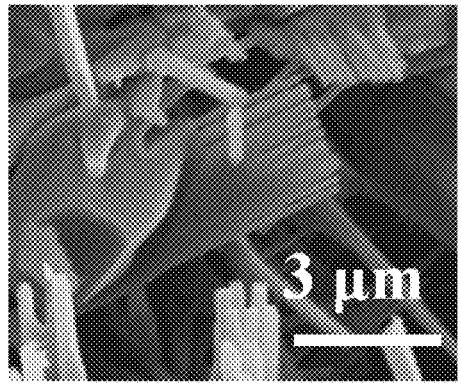
Figure 12F:
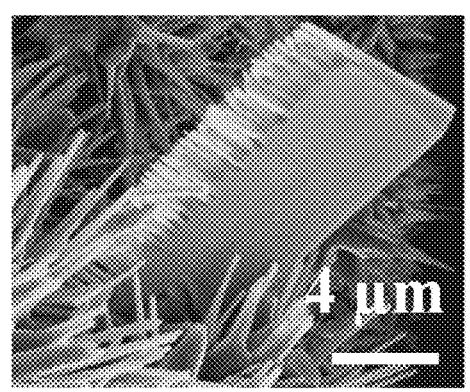

FIGS. 12A to 12F are photomicrographs of the zinc oxide nanowires produced from the zinc metal powder or granules. FIGS. 12B and 12C show flowery-shaped zinc oxide nanowires with a high density of nanowires with uniform diameters. FIG. 12D shows a tripod structure, while FIG. 12E shows a nanobrush, and FIG. 12F shows a nanocomb (also shown in FIG. 12C) of ZnO nanowires.

Example 3

Titanium metal powder or granules (greater than about 10 microns) (titanium powder, spherical, 150 mesh, 99.9%, Catalog No. 41545 from Alfa Aesar) were allowed to fall under gravity through the plasma jet in the quartz tube and nanowires were collected from the bottom of the tube. The obtained nanowires were made of titania and had diameters from about 100 to about 500 nm and lengths of about 1 to about 10 microns. The microwave power for form titania nanowires was at less than about 1000 W, and more specifically, about 700 W.

Figure 13A:
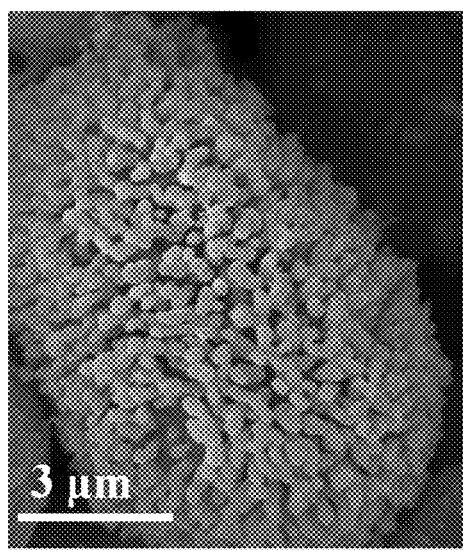
FIGS. 13A to 13B are photomicrographs of titanium dioxide nanowires produced from titanium metal powder according to one embodiment of the invention and as described in Example 3.
Figure 13B:
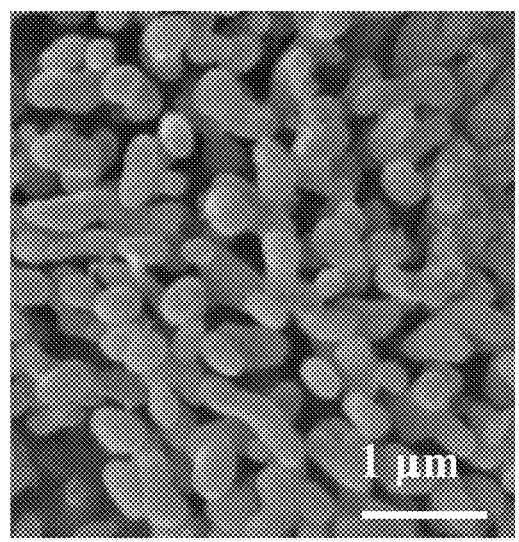

FIGS. 13A to 13B are photomicrographs of the titanium dioxide nanowires produced from the titanium metal powder or granules.

Example 4

Figure 14A:
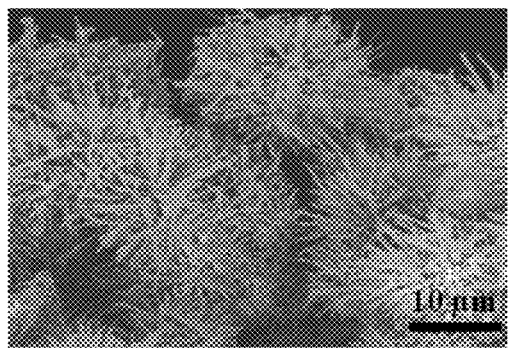
FIGS. 14A to 14B are photomicrographs of copper-zinc oxide nanowires/nanobelts produced from copper-zinc metal powder according to one embodiment of the invention and as described in Example 4.
Figure 14B:
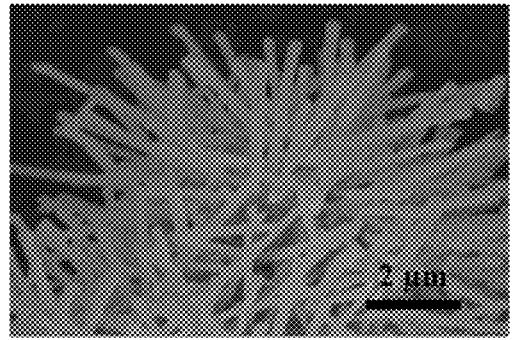
Figure 15A:
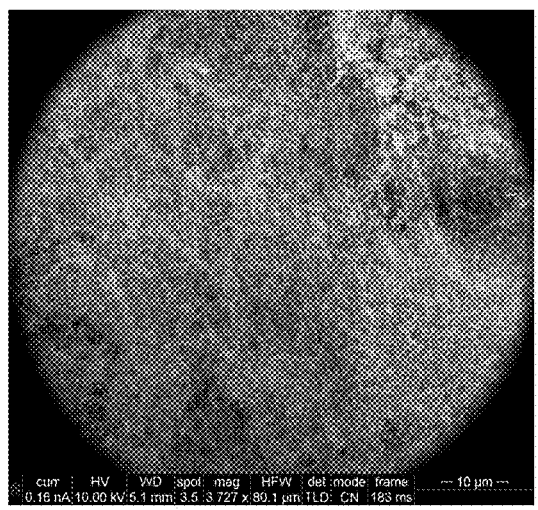
FIGS. 15A to 15F are photomicrographs of tin oxide nanowires produced from tin metal powders according to one embodiment of the invention and as described in Example 5.
Figure 15B:
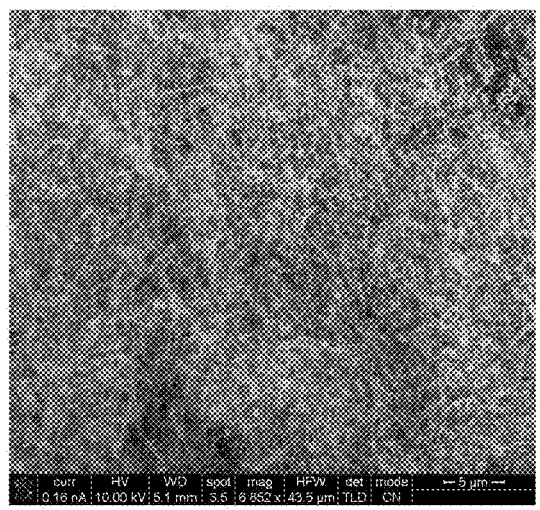
Figure 15C:
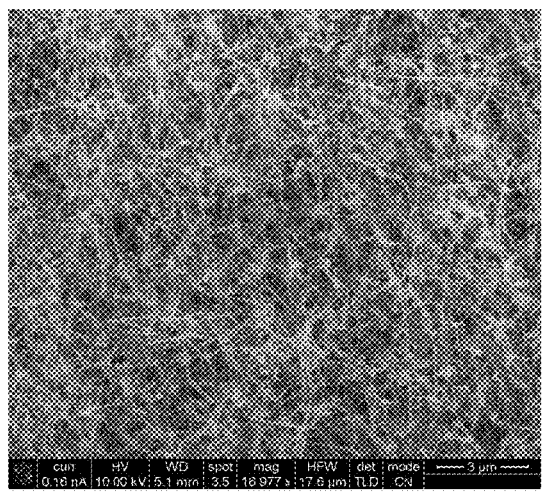
Figure 15D:
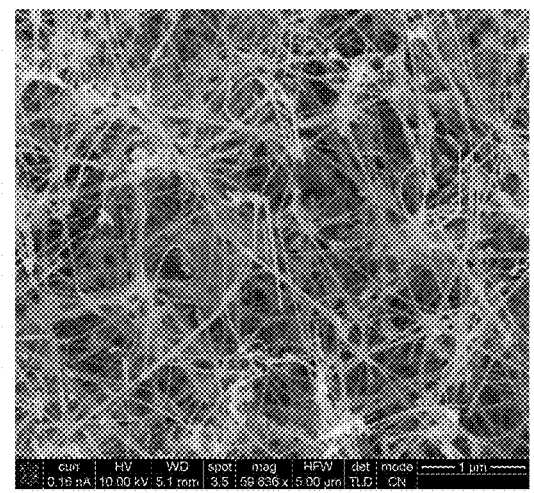
Figure 15E:
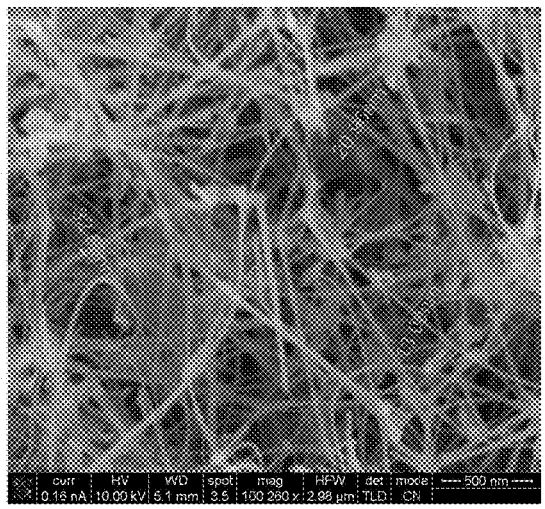
Figure 15F:
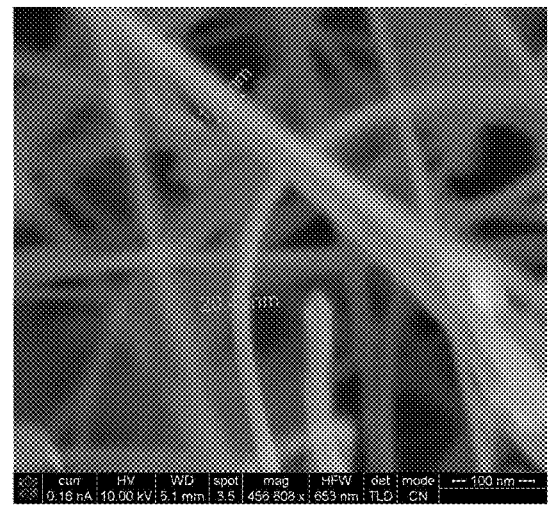

Copper-zinc alloy powder or granules (about 100 nm) (Catalog No. 593583 from Sigma Aldrich) were allowed to fall under gravity through the plasma jet in the quartz tube and the reaction product was collected from the bottom of the dielectric tube. The obtained product took the form of copper-zinc oxide nanowires/nanobelts and had diameters from about 100 to about 800 nm and lengths of about 10 to about 50 microns. FIGS. 14A to 14B are photomicrographs of the copper-zinc oxide nanowires/nanobelts.

Example 5

Using the reactor illustrated in FIGS. 3-7 with an approximately about 75 cm long, about 22 mm inside diameter dielectric tube of quartz, tin metal powder or granules (100 nm) (tin powder, APS approx. 0.1 micron, Catalog No. 43461 from Alfa Aesar) were placed in conical funnel 76 and argon gas was delivered to push the metal through the funnel. A plasma-forming gas of about 500 sccm of $O_2$ and 2 slpm of argon were delivered to the quartz tube via gas inlet 58. The plasma power was about 1500 watts. About 15 slpm of air was delivered through sheath gas inlets 64 and 66. The powder delivery system was kept at less than about 100° C. by flowing cooling water into coolant inlet 60 and out of coolant outlet 62.

Very high quality (with diameters less than about 100 nm, uniform size distribution, and a low percentage of other nanostructures) tin oxide nanowires were produced and collected in a nanowire product collector as shown in FIG. 9. The nanowires had diameters as low as about 15 nm with a mean diameter of about 40 nm and a maximum diameter of about 100 nm. The length of the tin oxide nanowires was about 5 microns. The efficiency of nanowire production was at least about 90%. FIGS. 15A to 15F are photomicrographs of the tin oxide nanowires at various magnifications.

Example 6

Using the reactor illustrated in FIGS. 3-7 with an approximately about 75 cm long, about 22 mm inside diameter dielectric tube of quartz, tin metal powder or granules (about 100 nm) were placed in conical funnel 76 and argon gas was delivered to push the metal through the funnel. A plasma-forming gas of about 700 sccm of $O_2$, 2 slpm of argon, and about 100 sccm of hydrogen gas were delivered to the quartz tube via gas inlet 58. The plasma power was about about 1500 watts. About 10 slpm of air was delivered through sheath gas inlets 64 and 66. The powder delivery system was kept at less than about 100° C. by flowing cooling water into coolant inlet 60 and out of coolant outlet 62.

Figure 16:
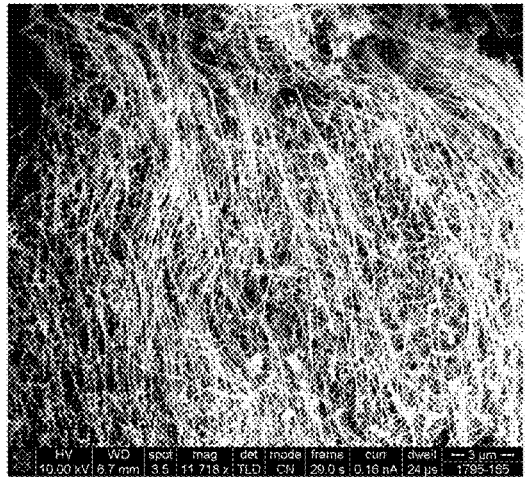
FIGS. 16A to 16C are photomicrographs of tin oxide nanowires produced from tin metal powders according to one embodiment of the invention and as described in Example 6.
Figure 16:
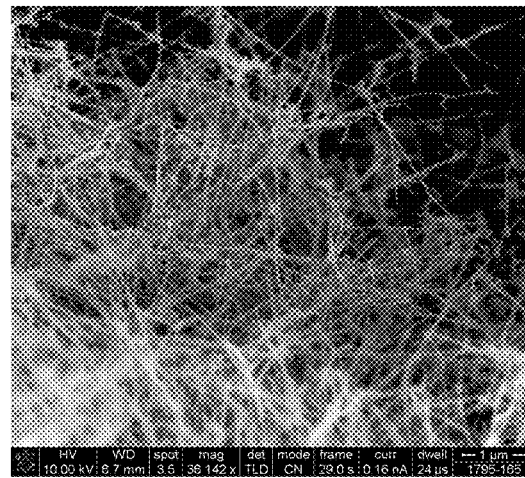
Figure 16:
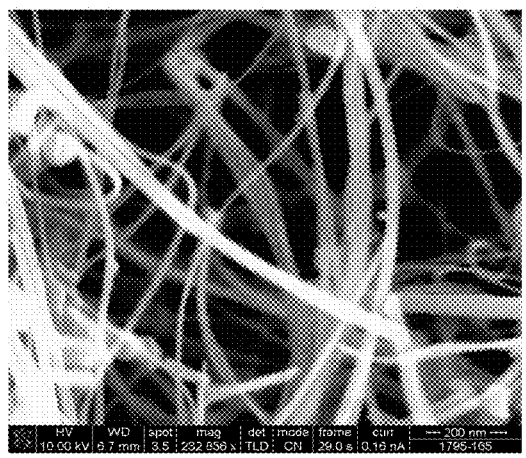

Very high quality (with diameters less than about 100 nm, uniform size distribution, and a low percentage of other nanostructures) tin oxide nanowires were produced and collected in a nanowire product collector as shown in FIG. 9. The nanowires had diameters of about 20 nm to about 30 nm and a length of several microns. The efficiency of nanowire production was at least about 90%. FIGS. 16A to 16C are photomicrographs of the obtained tin oxide nanowires at various magnifications.

Example 7

Aluminum metal powder or granules (about 3-4.5 microns in size) (Aluminum powder, spherical, 97.5%, Catalog No. 41000 from Alfa Aesar) were allowed to fall under gravity through the plasma jet in the quartz tube and nanowires were collected from the bottom of the tube. The obtained nanowires were made of alumina and had diameters from about 100 to about 500 nm and lengths of about 1 to about 10 microns.

Figure 17A:
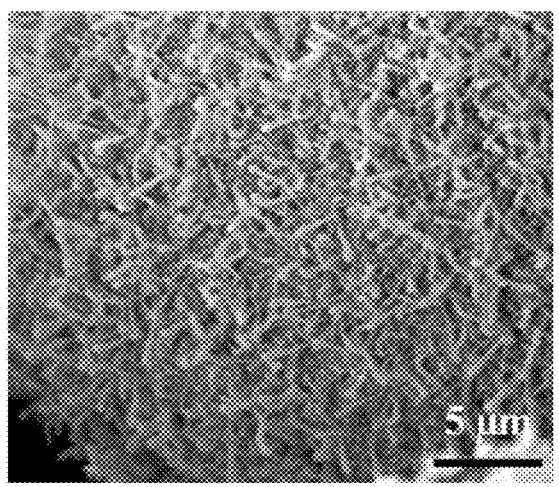
FIGS. 17A to 17B are photomicrographs of aluminum oxide nanowires produced from aluminum metal powder according to one embodiment of the invention and as described in Example 7.
Figure 17B:
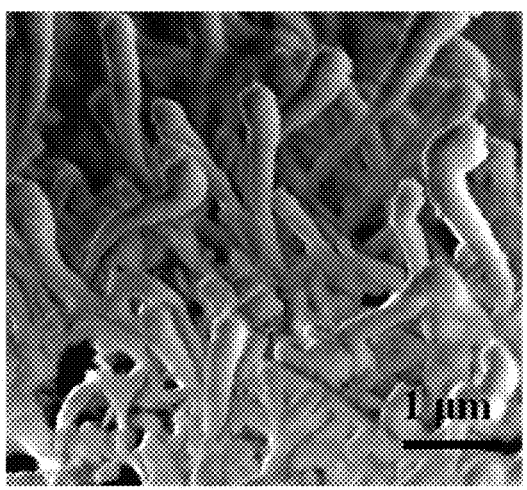

FIGS. 17A (low resolution) to 17B (high resolution) are photomicrographs of the aluminum dioxide nanowires produced from the aluminum metal powder or granules. The $Al_2O_3$ nanowires tend to be inverted funnel shaped and protrudes out from the bulk metal in a flowery pattern. Further, straight and isolated $Al_2O_3$ nanowires have also been observed.

Example 8

Aluminum metal powder or granules (about 3 to about 10 microns) (Aluminum metal powder, spherical, 97.5%, Catalog No. 41000 from Alfa Aesar) were allowed to fall under gravity through the plasma jet in the quartz tube and nanoparticles were collected from the bottom of the tube. In this case, the microwave power required to form nanoparticles is greater than that required to form nanowires. For example, to form alumina nanoparticles, the microwave power must be equal to or greater than about 1300 W with about 10 slpm air, about 2 slpm Argon, about 100 sccm of $H_2$ and about 500 sccm of $O_2$. At lower microwave powers, such as less than about 1300 W, and more specifically, about about 800 W, alumina nanowires were formed. The obtained nanoparticles were made of alumina and had diameters from about 50 to about 100 nm. Without being held to any particular theory, it is believed that nanoparticle formation occurs only under the vaporization conditions of the higher microwave power and not in molten conditions.

Figure 18A:
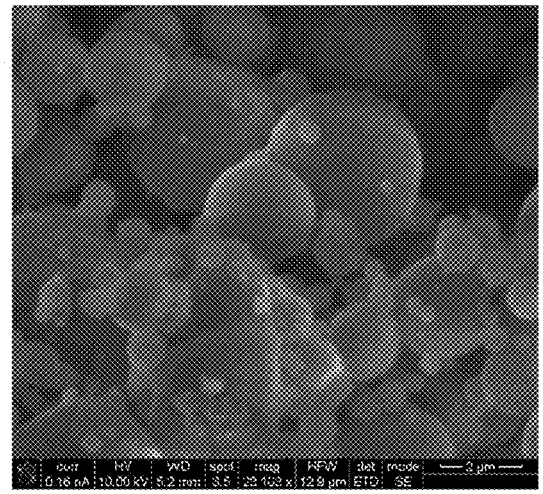
FIGS. 18A to 18B are photomicrographs of aluminum oxide (alumina) nanoparticles (18B) produced from aluminum metal powder (18A) according to one embodiment of the invention and as described in Example 8.
Figure 18B:
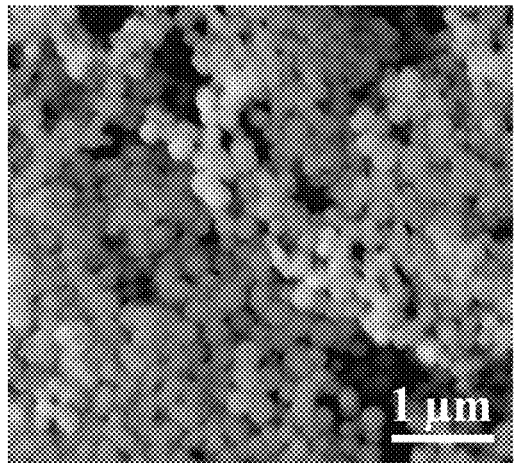

FIGS. 18A to 18B are photomicrographs of the about 50 to about 100 nm size aluminum dioxide nanoparticles (18B) produced from the 5-10 micron size aluminum metal powder or granules (18A).

Example 9

Titanium metal powder or granules (greater than about 10 microns, about 20 to about 100 microns) (titanium powder, spherical, 150 mesh, 99.9%, Catalog No. 41545 from Alfa Aesar) were allowed to fall under gravity through the plasma jet in the quartz tube and nanoparticles were collected from the bottom of the tube. In this case, the microwave power required to form titania nanoparticles is about 1000 W with about 10 slpm air, about 2 slpm Argon, about 100 sccm of $H_2$ and about 500 sccm of $O_2$. At lower microwave powers, such as less than about 1000 W, and more specifically, about 700 W, titanina nanowires were formed. The obtained nanoparticles were made of titania and had diameters from about 50 to about 100 nm.

Figure 19A:
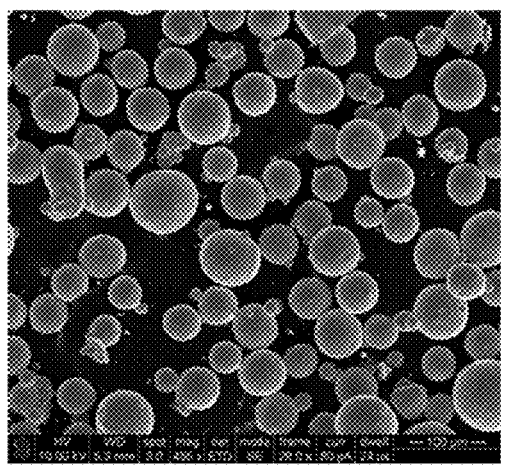
FIGS. 19A to 19B are photomicrographs of titanium oxide (titania) nanoparticles (19B) produced from titanium metal powder (19A) according to one embodiment of the invention and as described in Example 9.
Figure 19B:
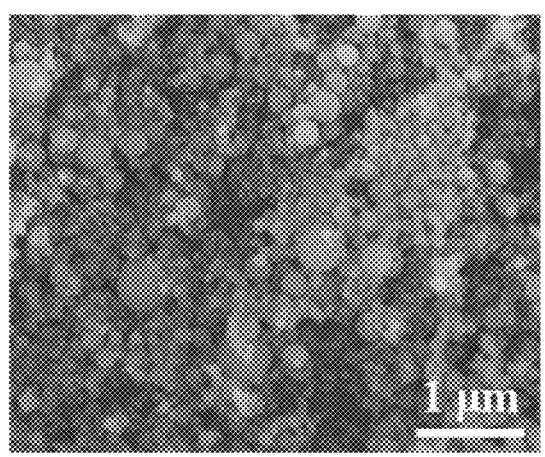

FIGS. 19A to 19B are photomicrographs of the about 50 to about 100 nm titanium dioxide nanoparticles produced from the about 20 to about 100 micron size titanium metal powder or granules. It appears that alumina nanoparticles have more uniform size distribution compared to titania nanoparticles. Without being held to any particular theory, it is believed that the more uniform alumina nanoparticles could be due to the smaller size of the alumina starting metal, with Al metal powder or granules being about 5 to about 10 microns compared with Ti metal powder or granules at about 20 to about 100 microns.

Example 10

Zinc metal powder or granules (from about 1 micron to 45 microns) were used in an embodiment of a reactor (FIG. 20) similar to that used in the above Examples. Briefly, the zinc metal powder was delivered by a powder feeder and was allowed to fall under gravity through the plasma jet in a quartz dielectric tube. To form the plasma jet, oxygen gas delivered at 2.5 slpm served as a plasma-forming gas and nitrogen gas delivered at 12.5 slpm served as a sheath gas. Microwave energy of 1 kW was applied to the oxygen and nitrogen gas to form the plasma.

The reactor further comprised a product collector in communication with the 2 inch dielectric tube. The product collector was cylindrically shaped and was 5 inches in diameter and 10 inches long. The product collector comprised a collecting cup and a filter. The collecting cup was a quartz beaker oriented to hold materials that fell through the dielectric tube (e.g., FIG. 9). The filter was a grooved high-efficiency particulate air filter. The air filter was wound around a cylindrical wire frame that was 2 inches in diameter and 8 inches long. The filter was situated downstream of the collecting cup and was oriented to point in the direction of air flow. The product collector also comprised a 1.5 inch diameter exhaust tube downstream of the filter.

Figures 21A, 21B:
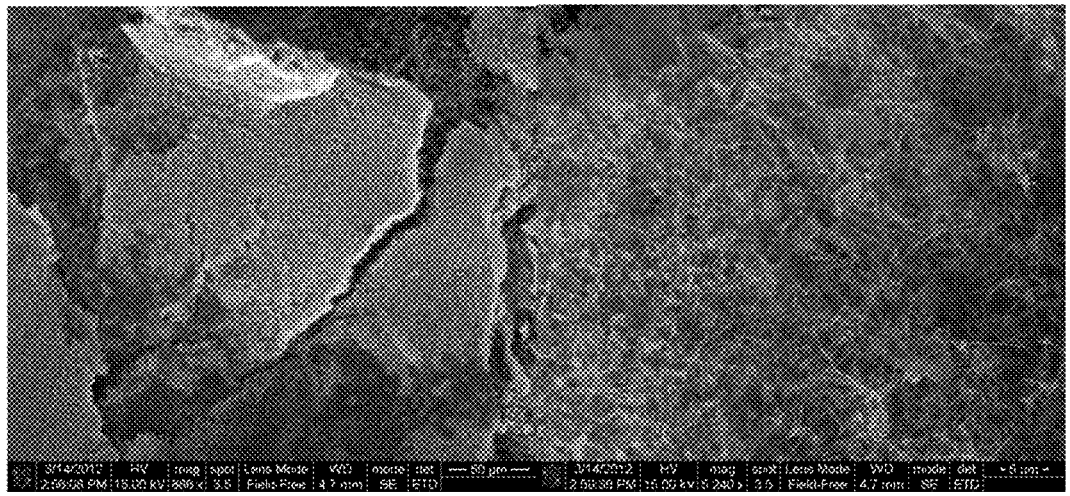
Figures 21C, 21D:
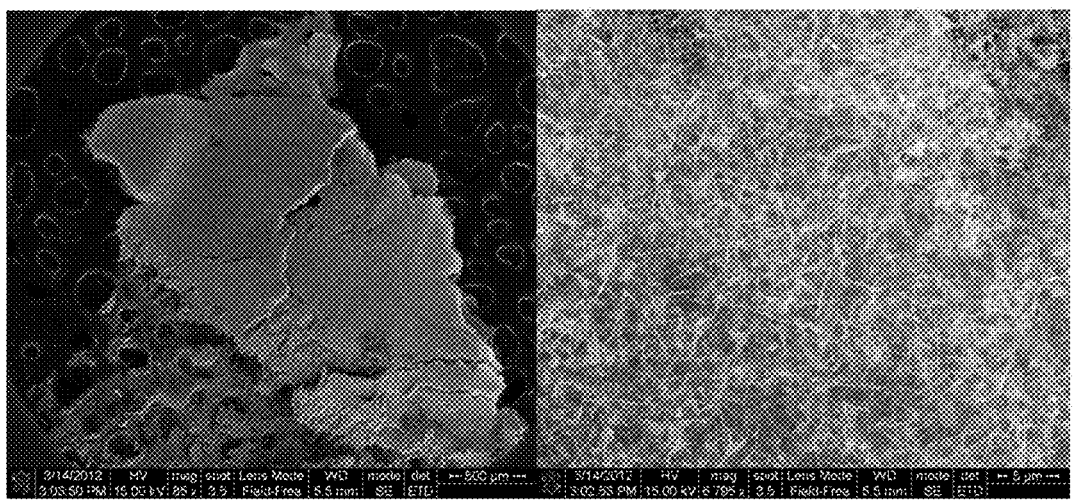
Figure 21I:
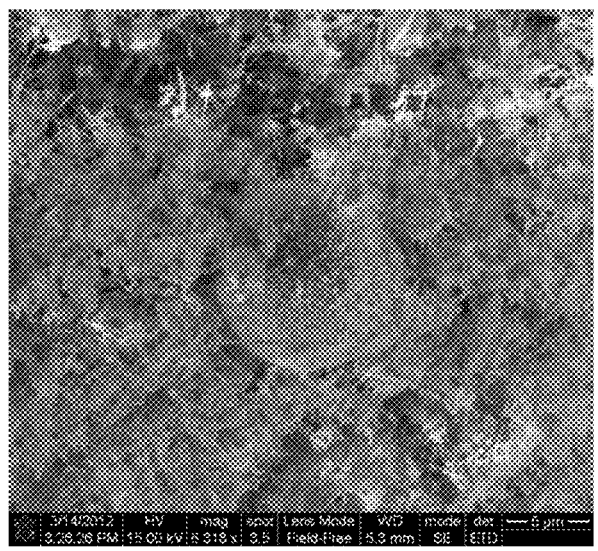

The zinc metal powder was fed at a rate of 3 g/min. Subsequently, zinc oxide nanostructures were collected from the dielectric tube, the collecting cup, and the filter. Photomicrographs and analysis of the respective nanostructures showed that the nanostructures collected from the dielectric tube and collecting cup had diameters of about 20 nm to about 100 nm and lengths of about 1 μm to about 10 μm (FIGS. 21A to 21B, 21F to 21I), whereas nanostructures collected from the filter had diameters of about 15 nm to about 30 nm and lengths of about 100 μm (FIGS. 21C to 21E). It was also observed that the material collected from the filters comprised mostly if not entirely zinc oxide nanostructures (FIGS. 21C to 21E), whereas the material in the collection cup was not fully converted and comprised both zinc metal powder and zinc oxide nanostructures (FIGS. 21F to 21I).

One of ordinary skill in the art will recognize that additional configurations are possible without departing from the teachings of the invention or the scope of the claims which follow. This detailed description, and particularly the specific details of the exemplary embodiments disclosed, is given primarily for completeness and no unnecessary limitations are to be imputed therefrom, for modifications will become obvious to those skilled in the art upon reading this disclosure and may be made without departing from the spirit or scope of the claimed invention.

What is claimed is:

1. A method for producing metal oxide nanowires, the method comprising:
   a. providing a reactor having:
      1) a dielectric tube, wherein the dielectric tube defines an inlet end, an exit end, and a longitudinal axis traversing from the inlet end to the exit end;
      2) a microwave energy generator in communication with the dielectric tube, wherein the microwave energy generator is configured to deliver microwave energy into the dielectric tube;
      3) a plasma-forming gas inlet in communication with the dielectric tube, and configured to deliver a plasma-forming gas into the dielectric tube substantially parallel to the longitudinal axis;
      4) a sheath gas inlet in communication with the dielectric tube, and configured to deliver a sheath gas into the dielectric tube substantially parallel to the longitudinal axis;
      5) a metal powder delivery system mounted at the inlet end and in communication with the dielectric tube, wherein the metal powder delivery system is oriented relative to the dielectric tube such that metal powder can be gravity-fed into the dielectric tube substantially parallel to the longitudinal axis; and,
      6) a product collector mounted at the outlet end and in communication with the dielectric tube, wherein the product collector is oriented relative to the dielectric tube such that a product formed in the dielectric tube can be received by and retained in the product collector;
   b. delivering a plasma-forming gas and a sheath gas to the dielectric tube via the plasma-forming gas inlet and the sheath gas inlet, respectively;
   c. applying a microwave energy to the plasma-forming gas in the dielectric tube to form a plasma;
   d. delivering a metal powder having a particle diameter of less than about 1 micron up to about 45 microns into the dielectric tube from the metal powder delivery system such that the metal powder reacts at temperatures close to the metal's melting point within the plasma along the longitudinal axis of the dielectric tube to produce metal oxide nanowires; and, e. collecting the metal oxide nanowires produced in Step d) in the product collector;

wherein the metal oxide nanowire is defined as a nanoparticle having a first dimension and a second dimension wherein the first dimension is greater than the second dimension.

2. The method of claim 1 wherein the metal powder is reacted within the plasma in the absence of a substrate or a catalyst or a template.

3. The method of claim 1 wherein the metal powder is delivered into the dielectric tube at a flow rate of up to about 200 grams/hour.

4. The method of claim 1 wherein the microwave power delivered to the dielectric tube is from 300 W to 3 kW.

5. The method of claim 1 wherein the metal powder is selected from a group consisting of tin, zinc, tungsten, titanium, iron, gallium, indium, bismuth, niobium, aluminum, vanadium, copper, and combinations thereof.

6. The method of claim 1 wherein the plasma-forming gas comprises argon, an oxidative gas, water vapor, hydrogen gas, or combinations thereof.

7. The method of claim 1 wherein the sheath gas is delivered into the dielectric tube to form a helical sheath gas path.

8. The method of claim 1 wherein the sheath gas comprises air.

9. The method of claim 1 further comprising the step of separating the nanowires from a stream of the nanowires and unreacted metal powder.

10. The method of claim 1 wherein the product collector further comprises a filter bag, and the step of collecting the metal oxide nanowires comprises collecting the metal oxide nanowires from the filter bag.

11. The method of claim 1 further comprising the step of recycling unreacted metal powder into the plasma.

* * * * *